United States Patent
Pankaj et al.

(10) Patent No.: US 10,787,887 B2
(45) Date of Patent: *Sep. 29, 2020

(54) METHOD OF PERFORMING INTEGRATED FRACTURE AND RESERVOIR OPERATIONS FOR MULTIPLE WELLBORES AT A WELLSITE

(71) Applicant: SCHLUMBERGER TECHNOLOGY CORPORATION, Sugar Land, TX (US)

(72) Inventors: Piyush Pankaj, Sugar Land, TX (US); Hitoshi Onda, Houston, TX (US); Sumant Kamat, Stafford, TX (US); Iakov Kozlov, Astana (KZ)

(73) Assignee: Schlumberger Technology Corporation, Sugar Land, TX (US)

( * ) Notice: Subject to any disclaimer, the term of this patent is extended or adjusted under 35 U.S.C. 154(b) by 370 days.

This patent is subject to a terminal disclaimer.

(21) Appl. No.: 15/750,920

(22) PCT Filed: Aug. 8, 2016

(86) PCT No.: PCT/US2016/045940
§ 371 (c)(1),
(2) Date: Feb. 7, 2018

(87) PCT Pub. No.: WO2017/027433
PCT Pub. Date: Feb. 16, 2017

(65) Prior Publication Data
US 2018/0230782 A1    Aug. 16, 2018

Related U.S. Application Data

(60) Provisional application No. 62/202,475, filed on Aug. 7, 2015.

(51) Int. Cl.
G06G 7/58 (2006.01)
E21B 41/00 (2006.01)
(Continued)

(52) U.S. Cl.
CPC .......... E21B 41/0092 (2013.01); E21B 43/17 (2013.01); E21B 43/26 (2013.01);
(Continued)

(58) Field of Classification Search
CPC .... E21B 43/26; E21B 43/267; E21B 41/0092; E21B 49/00; G01V 1/288; G01V 99/005
(Continued)

(56) References Cited

U.S. PATENT DOCUMENTS

| 6,101,447 A | 8/2000 | Poe, Jr. |
| 7,085,696 B2 | 8/2006 | King |

(Continued)

FOREIGN PATENT DOCUMENTS

| WO | 2013016733 A1 | 1/2013 |
| WO | 2013055930 A1 | 4/2013 |

(Continued)

OTHER PUBLICATIONS

Gu et al., "Hydraulic Fracture Crossing Natural Fracture at Non-Orthogonal Angles, A criterion, Its Validation and Applications", SPE 139984 presented at the SPE Hydraulic Fracturing Conference and Exhibition, The Woodlands, Texas, Jan. 24-26, 2011, 11 pages.
(Continued)

*Primary Examiner* — Andre Pierre Louis
(74) *Attorney, Agent, or Firm* — Cathy Hewitt

(57) ABSTRACT

A method of performing oilfield operations at a wellsite is disclosed. The wellsite is positioned about a subterranean formation having multiple wellbores therethrough and a fracture network therein. The fracture network includes natural fractures. The method involves generating fracture
(Continued)

parameters including a hydraulic fracture network of a fracture grid for each of the multiple wellbores based on wellsite data including microseismic events and a mechanical earth model, generating reservoir parameters including an updated mechanical earth model of a reservoir grid based on the wellsite data and the fracture parameters, generating integrated wellsite parameters including an integrated earth model by integrating the fracture parameters from the multiple wellbores with the reservoir parameters, and performing production operations at the multiple wellbores based on the integrated wellsite parameters.

14 Claims, 13 Drawing Sheets

(51) Int. Cl.
| | |
|---|---|
| E21B 43/26 | (2006.01) |
| E21B 43/17 | (2006.01) |
| E21B 47/10 | (2012.01) |
| E21B 49/00 | (2006.01) |
| G01V 1/28 | (2006.01) |
| G01V 1/30 | (2006.01) |
| G05B 17/02 | (2006.01) |
| G06G 7/50 | (2006.01) |
| E21B 43/267 | (2006.01) |

(52) U.S. Cl.
CPC ............ *E21B 47/101* (2013.01); *E21B 49/00* (2013.01); *G01V 1/282* (2013.01); *G01V 1/288* (2013.01); *G01V 1/301* (2013.01); *G05B 17/02* (2013.01); *E21B 43/267* (2013.01); *G01V 2210/1234* (2013.01); *G01V 2210/6242* (2013.01); *G01V 2210/644* (2013.01); *G01V 2210/646* (2013.01); *G01V 2210/663* (2013.01)

(58) Field of Classification Search
USPC ....................................................... 703/9, 10
See application file for complete search history.

(56) References Cited

U.S. PATENT DOCUMENTS

| | | | |
|---|---|---|---|
| 7,363,162 B2 | 4/2008 | Thambynayagam et al. | |
| 7,509,245 B2 | 3/2009 | Siebrits et al. | |
| 7,716,029 B2 | 5/2010 | Couet et al. | |
| 7,784,544 B2 | 8/2010 | Lindvig et al. | |
| 7,788,074 B2 | 8/2010 | Scheidt et al. | |
| 8,271,243 B2 | 9/2012 | Koutsabeloulis et al. | |
| 8,280,709 B2 | 10/2012 | Koutsabeloulis et al. | |
| 8,412,500 B2 | 4/2013 | Weng et al. | |
| 8,428,923 B2 | 4/2013 | Siebrits et al. | |
| 8,571,843 B2 | 10/2013 | Weng et al. | |
| 9,228,425 B2 | 1/2016 | Ganguly et al. | |
| 9,715,026 B2 | 7/2017 | Ejofodomi et al. | |
| 2004/0008580 A1 | 1/2004 | Fisher et al. | |
| 2004/0220846 A1 | 11/2004 | Cullick et al. | |
| 2008/0091396 A1 | 4/2008 | Kennon et al. | |
| 2008/0133186 A1 | 6/2008 | Li et al. | |
| 2008/0183451 A1 | 7/2008 | Weng et al. | |
| 2009/0095469 A1 | 4/2009 | Dozier | |
| 2010/0076738 A1 | 3/2010 | Dean et al. | |
| 2010/0088076 A1 | 4/2010 | Koutsabeloulis et al. | |
| 2010/0138196 A1* | 6/2010 | Hui ........................ E21B 43/00 703/1 |
| 2010/0250215 A1 | 9/2010 | Kennon et al. | |
| 2011/0029291 A1 | 2/2011 | Weng et al. | |
| 2011/0040536 A1 | 2/2011 | Levitan | |
| 2011/0120706 A1 | 5/2011 | Craig | |
| 2011/0125471 A1 | 5/2011 | Craig et al. | |
| 2011/0257944 A1 | 10/2011 | Du et al. | |
| 2012/0179444 A1 | 7/2012 | Utpal et al. | |
| 2012/0232859 A1 | 9/2012 | Pomerantz et al. | |
| 2012/0232872 A1 | 9/2012 | Nasreldin et al. | |
| 2013/0006597 A1 | 1/2013 | Craig | |
| 2013/0144532 A1 | 6/2013 | Williams et al. | |
| 2013/0215712 A1* | 8/2013 | Geiser ................... G01V 1/288 367/9 |
| 2013/0231781 A1 | 9/2013 | Chapman | |
| 2013/0238304 A1 | 9/2013 | Glinsky | |
| 2013/0304444 A1 | 11/2013 | Strobel et al. | |
| 2014/0052377 A1 | 2/2014 | Downie | |
| 2014/0076543 A1 | 3/2014 | Ejofodomi et al. | |
| 2014/0116776 A1 | 5/2014 | Marx et al. | |
| 2014/0149098 A1 | 5/2014 | Bowen et al. | |
| 2014/0151033 A1 | 6/2014 | Ku | |
| 2014/0151035 A1* | 6/2014 | Cohen ..................... E21B 43/26 166/250.15 |
| 2014/0188892 A1 | 7/2014 | Ludvigsen et al. | |
| 2014/0299315 A1 | 10/2014 | Chuprakov et al. | |
| 2014/0305638 A1 | 10/2014 | Kresse et al. | |
| 2014/0372089 A1 | 12/2014 | Weng et al. | |
| 2014/0379317 A1 | 12/2014 | Sanden et al. | |
| 2015/0120255 A1 | 4/2015 | King et al. | |
| 2015/0151035 A1 | 6/2015 | Huemer | |
| 2015/0186570 A1 | 7/2015 | Huang et al. | |
| 2015/0204174 A1 | 7/2015 | Kresse et al. | |
| 2015/0212224 A1 | 7/2015 | Williams | |
| 2016/0266278 A1 | 9/2016 | Holderby et al. | |
| 2016/0357883 A1 | 12/2016 | Weng et al. | |
| 2016/0357887 A1 | 12/2016 | Ortiz et al. | |

FOREIGN PATENT DOCUMENTS

| | | |
|---|---|---|
| WO | 2013067363 A1 | 5/2013 |
| WO | 2014105659 A1 | 7/2014 |
| WO | 2015003028 A1 | 1/2015 |
| WO | 2015069817 A1 | 5/2015 |
| WO | 2017007745 A1 | 1/2017 |
| WO | 2017027068 A1 | 2/2017 |
| WO | 2017027340 A1 | 2/2017 |
| WO | 2017027342 A1 | 2/2017 |

OTHER PUBLICATIONS

Kresse et al., "Numerical Modeling of Hydraulic Fracturing in Naturally Fractured Formations", 45th US Rock Mechanics/Geomechanics Symposium, San Francisco, CA, Jun. 26-29, 2011, 11 pages.

International Search Report and Written Opinion issued in International Patent Appl. No. PCT/US2016/045940 dated Nov. 11, 2016; 9 pages.

International Search Report and Written Opinion issued in International Patent Appl. No. PCT/US2016/021159 dated Jun. 23, 2016; 10 pages.

Suarez-Rivera, R., Behrmann, L., Green, S., Burghardt, J., Stanchits, S., Edelman, E., and Surdi, A., 2013. Defining Three Regions of Hydraulic Fracture Connectivity, in Unconventional Reservoir, Help Designing Completions with Improved Long-Term Productivity. Paper SPE 166505, presented at SPE ATCE, New Orleans, LA, Sep. 30-Oct. 2, 14 pages.

Warpinski, N.R., and Teufel, L.W., 1987. Influence of Geologic Discontinuities on Hydraulic Fracture Propagation (includes associated papers 17011 and 17074 ). SPE Journal of Petroleum Technology 39(2): 209-220.

Chuprakov, D. and Prioul, R., 2015. Hydraulic Fracture Height Containment by Weak Horizontal Interfaces. Paper SPE 173337 presented at HFTC, Woodlands, TX, Feb. 3-5, 17 pages.

Cipolla, C.L., Warpinski, N.R., Mayerhofer, M.J., Lolon, E.P., and Vincent, M.C., 2010. The Relationship Between Fracture Complexity, Reservoir Properties, and Fracture-Treatment Design, Paper SPE 115769 presented at SPE ATCE, Denver, CO, Sep. 21-24, 25 pages.

International Search Report and Written Opinion issued in International Patent Appl. No. PCT/US2016/045688 dated Nov. 22, 2016; 13 pages.

(56) References Cited

OTHER PUBLICATIONS

Weng et al., "Modeling of Hydraulic Fracture Propagation in a Naturally Fractured Formation", Paper SPE 140253 presented at the SPE Hydraulic Fracturing Conference and Exhibition, The Woodlands, Texas, USA, Jan. 24-26, 2011, 18 pages.
International Search Report and Written Opinion issued in International Patent Application No. PCT/US2016/045682 dated Nov. 22, 2016; 11 pages.

\* cited by examiner

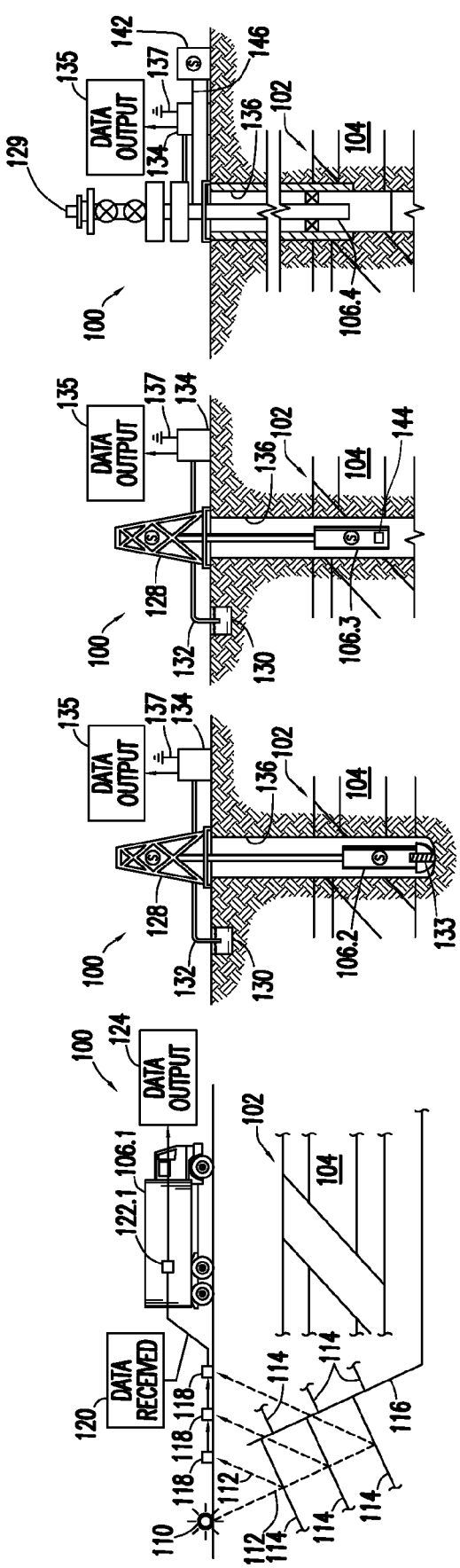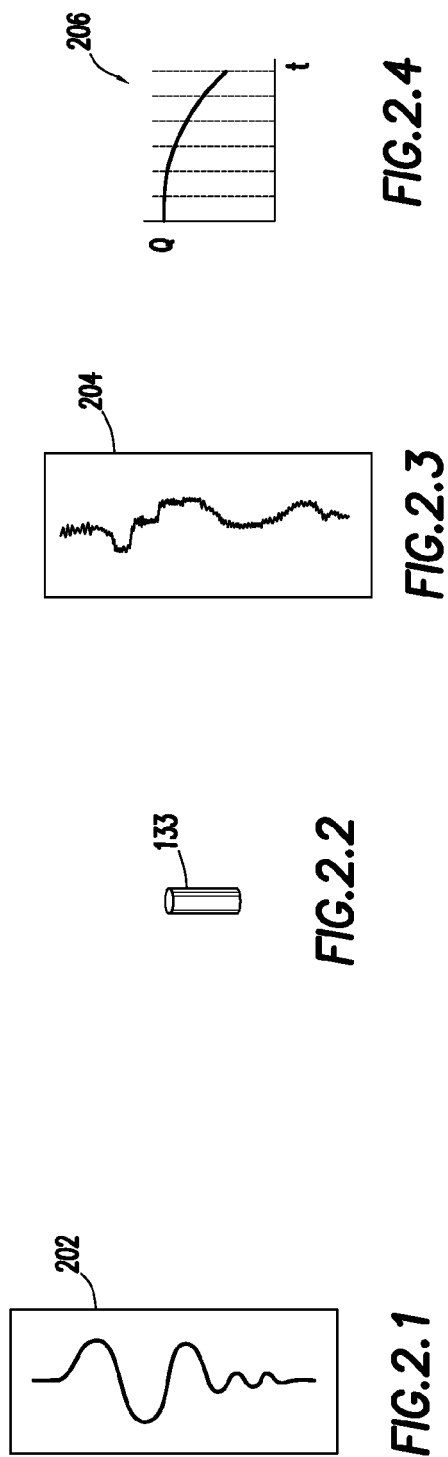

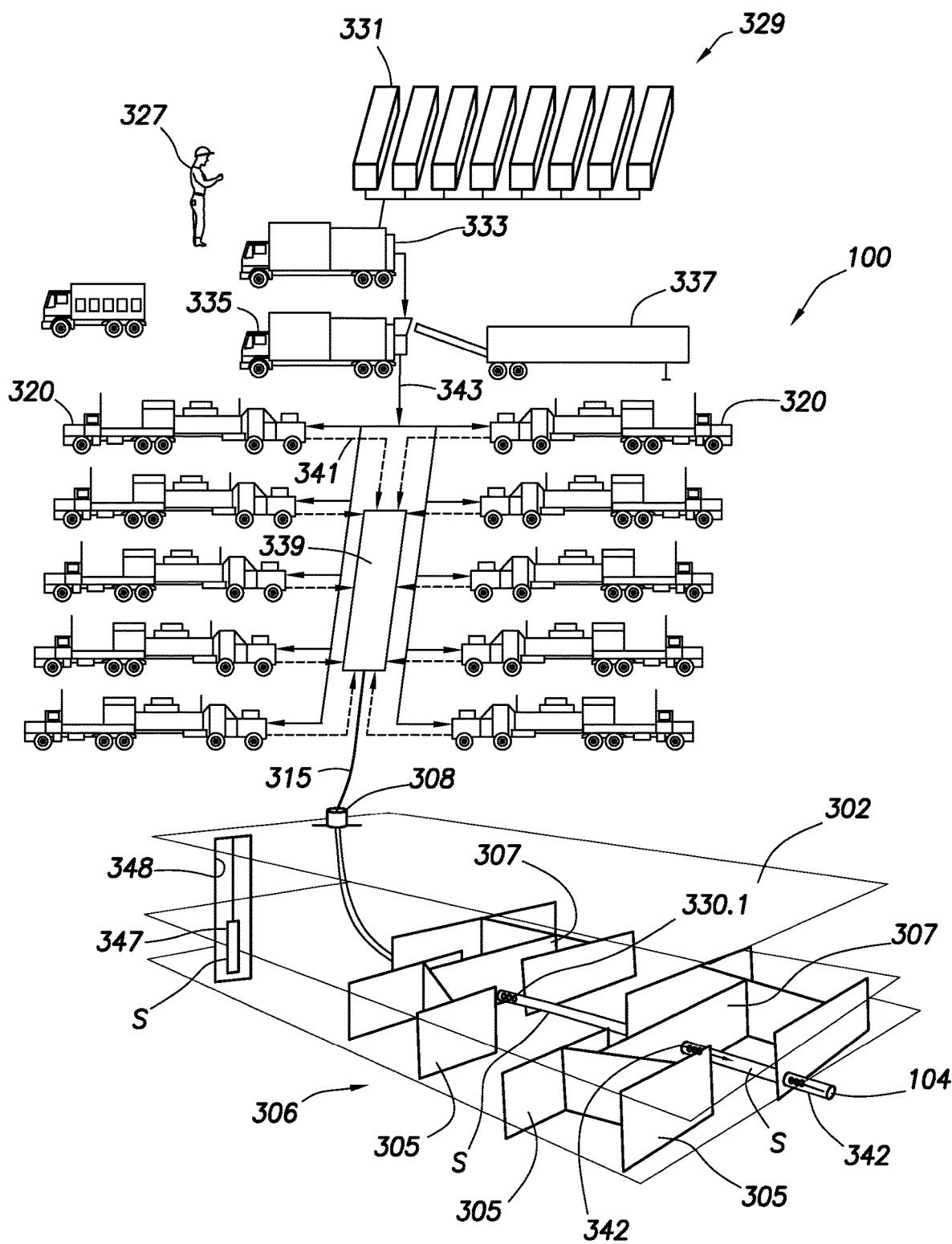
FIG.3.1

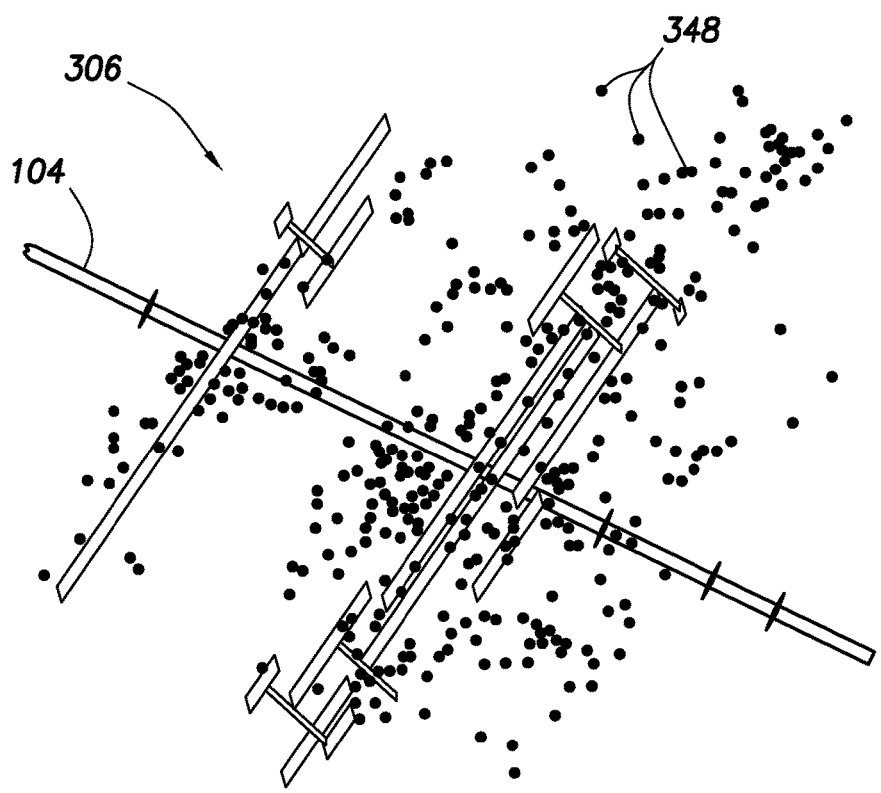
FIG.3.2
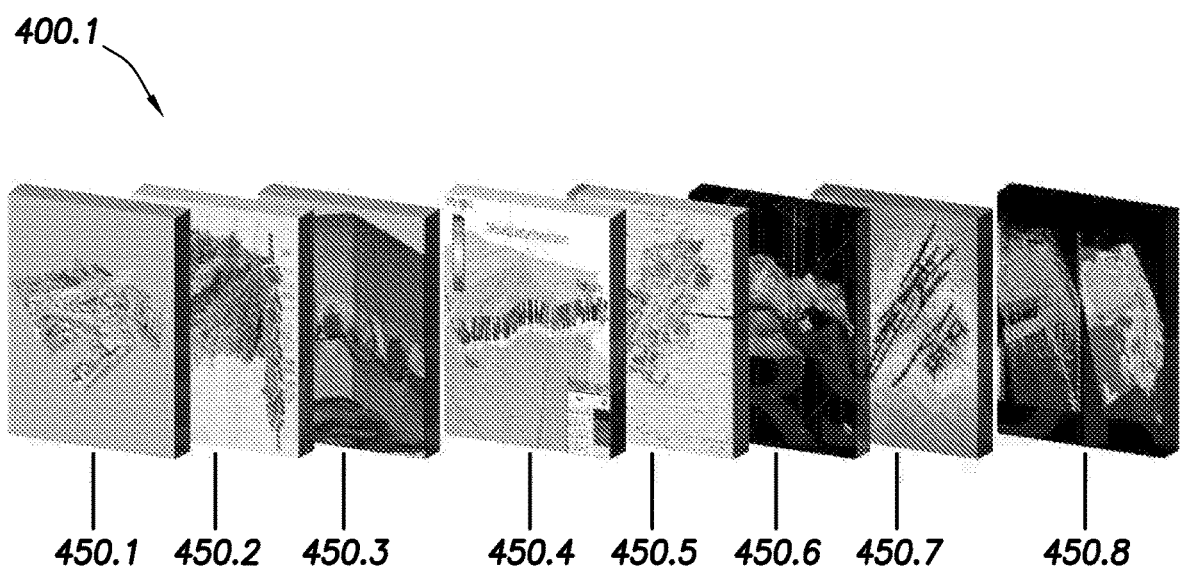
FIG.4.1

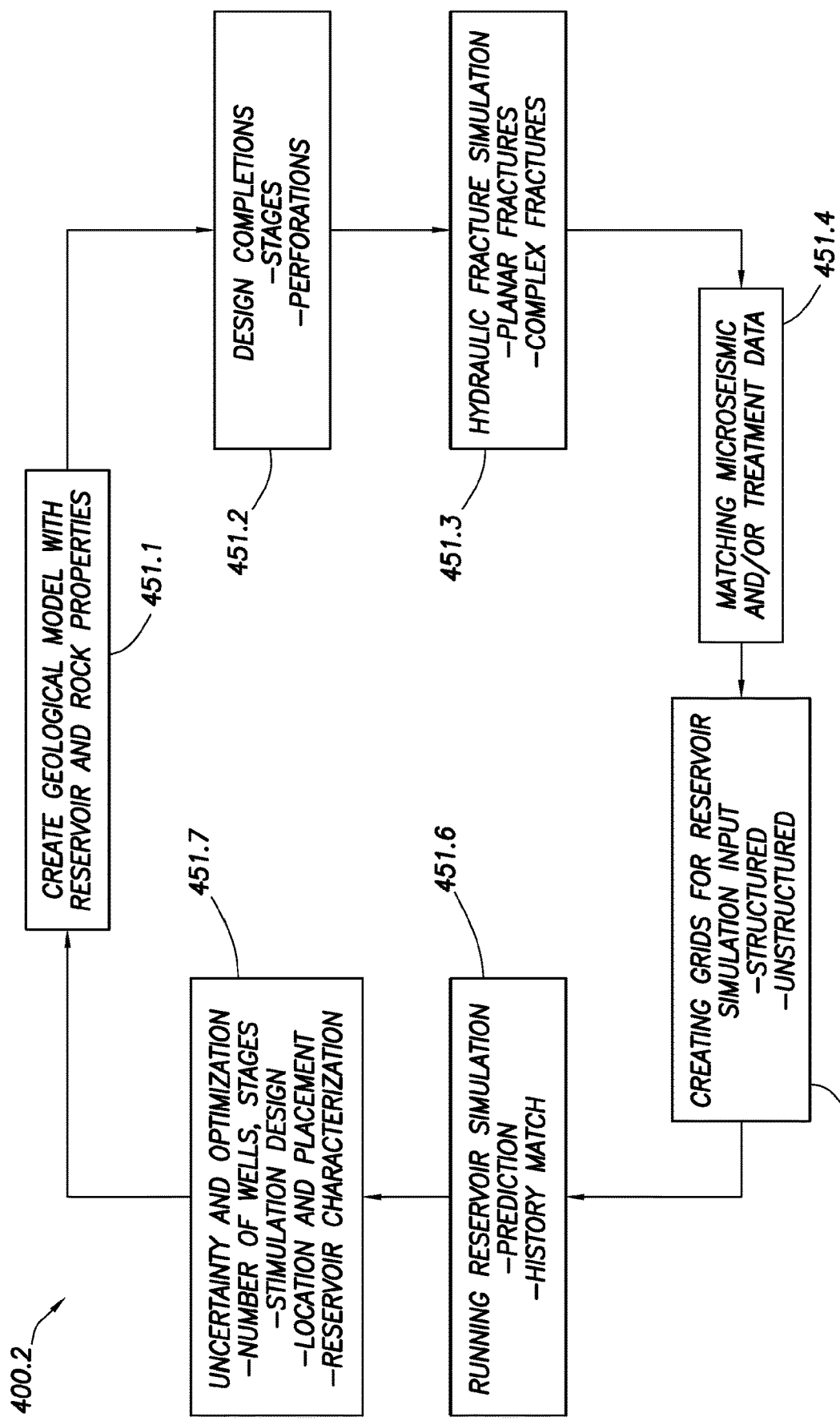
FIG. 4.2

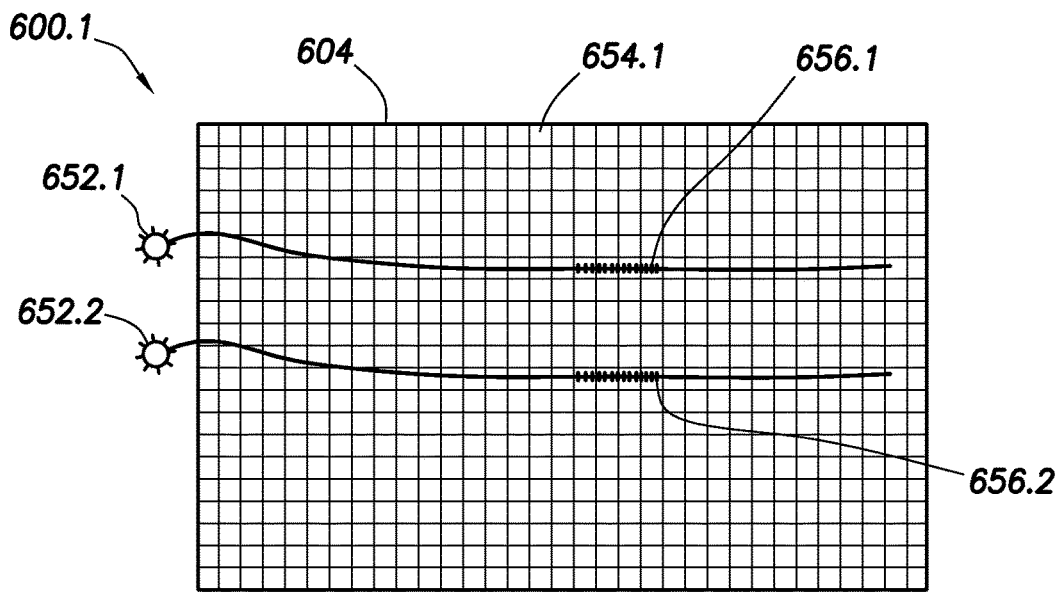
FIG.6.1
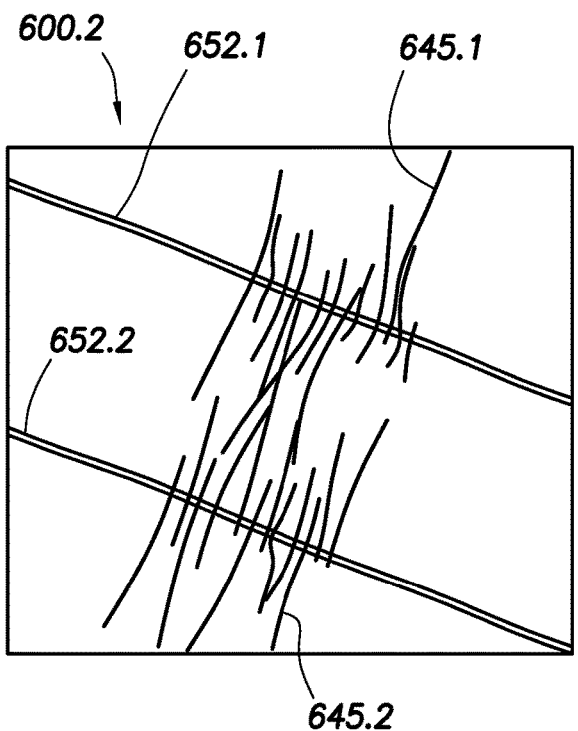
FIG.6.2
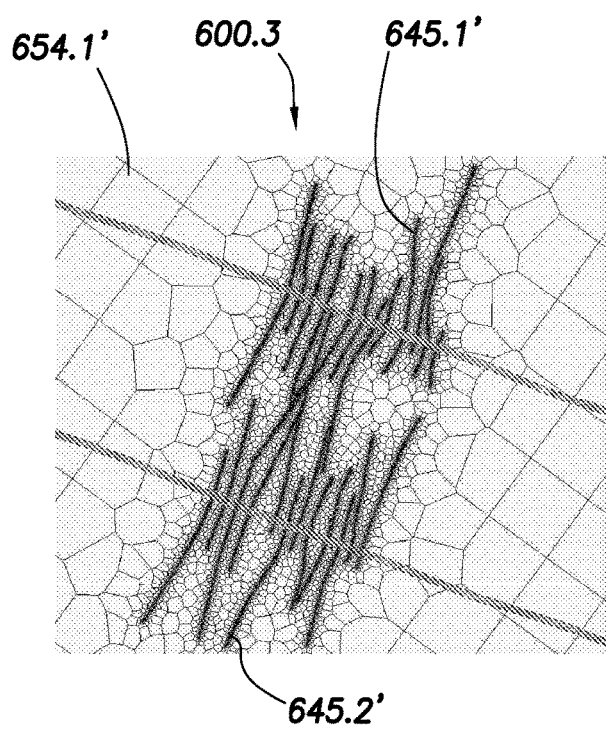
FIG.6.3

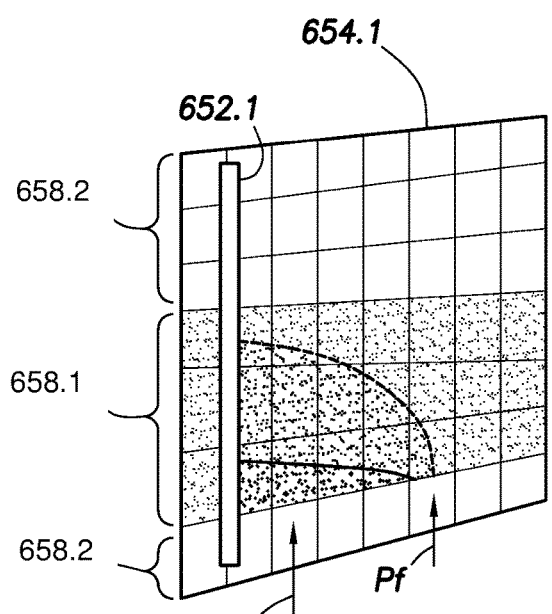
FIG.7.1
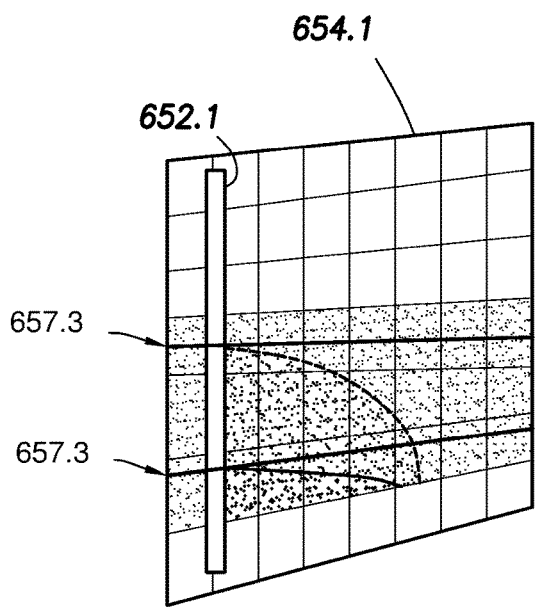
FIG.7.2
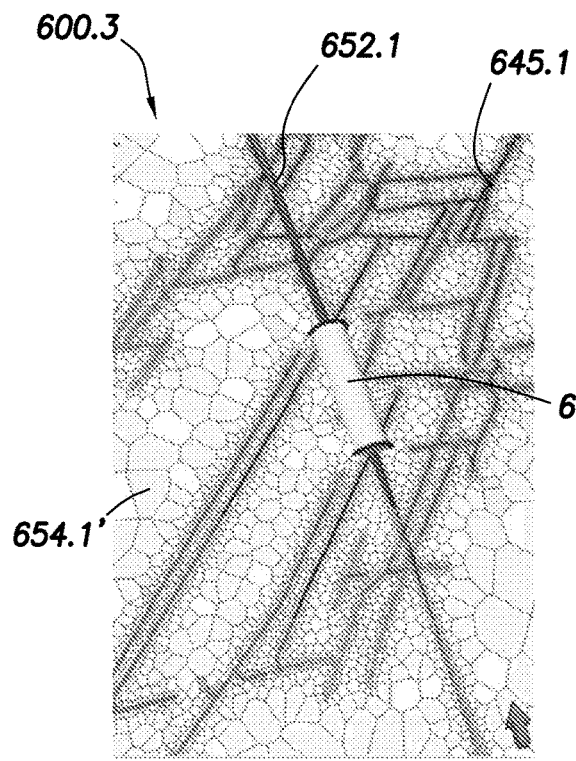
FIG.8.1
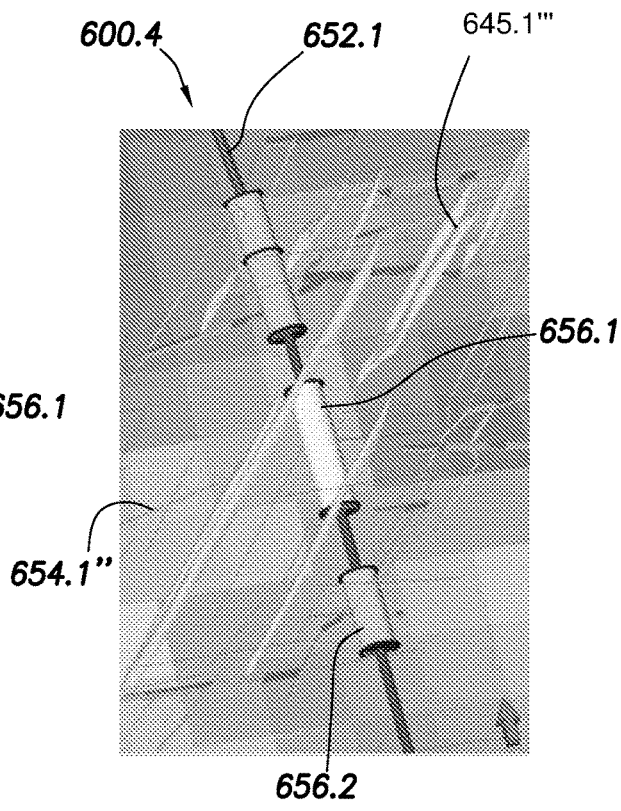
FIG.8.2

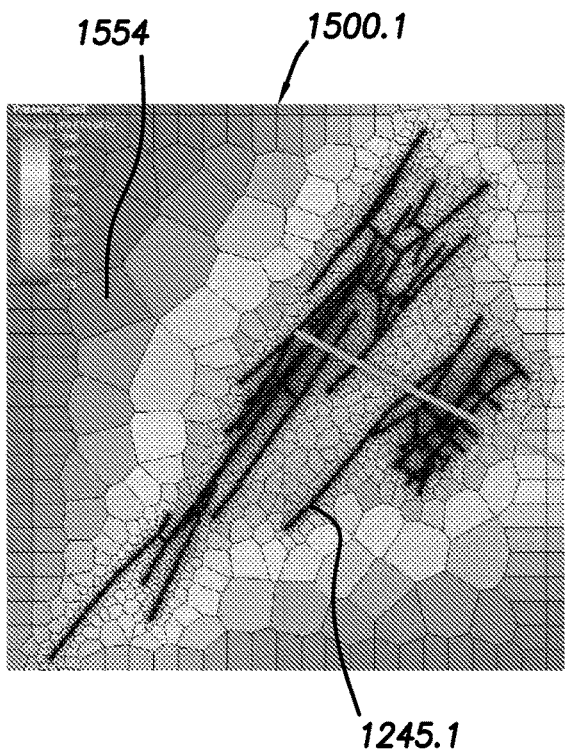
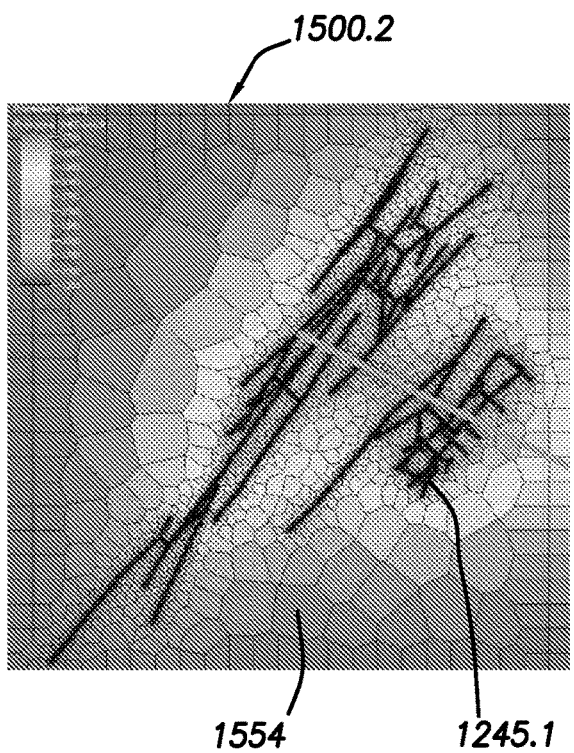
FIG.15.1   FIG.15.2
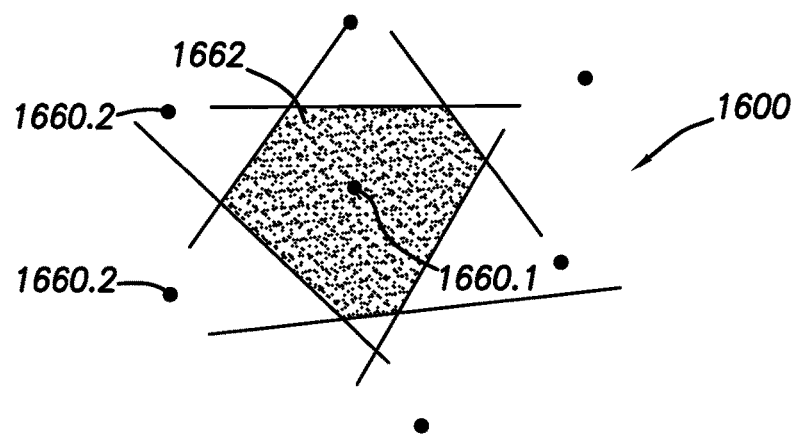
FIG.16

METHOD OF PERFORMING INTEGRATED FRACTURE AND RESERVOIR OPERATIONS FOR MULTIPLE WELLBORES AT A WELLSITE

CROSS-REFERENCE TO RELATED APPLICATIONS

The application claims the benefit of U.S. Provisional Application No. 62/202,475, filed on Aug. 7, 2015, the entire contents of which are hereby incorporated by reference herein.

BACKGROUND

The present disclosure relates generally to methods and systems for performing wellsite operations. More particularly, this disclosure is directed to methods and systems for performing fracture (or stimulation) operations and/or production operations at a wellsite.

In order to facilitate the recovery of hydrocarbons from oil and gas wells, the subterranean formations surrounding such wells can be stimulated using hydraulic fracturing. Hydraulic fracturing may be used to create cracks in subsurface formations to allow oil or gas to move toward the well. A formation may be fractured, for example, by introducing a specially engineered fluid (referred to as "injection fluid", "fracturing fluid", or "slurry" herein) at high pressure and high flow rates into the formation through one or more wellbores.

Patterns of hydraulic fractures created by the fracturing stimulation may be complex and may form a complex fracture network. Hydraulic fractures may extend away from the wellbore in various directions according to the natural stresses within the formation. Fracture networks may be measured by monitoring seismic signals of the earth to detect subsurface event locations.

Fracture networks may also be predicted using models. Examples of fracture models are provided in U.S. Pat. Nos. 6,101,447, 7,363,162, 7,509,245, 7,788,074, 8,428,923, 8,412,500, 8,571,843, 20080133186, 20100138196, and 20100250215, and PCT Application Nos. WO2013/067363, PCT/US2012/48871 and US2008/0183451, and PCT/US2012/059774, the entire contents of which are hereby incorporated by reference herein.

Despite the advances in fracturing techniques, there remains a need to provide a more meaningful understanding of fracture parameters in order to properly predict and/or design fracture operations to generate desired production at the wellsite. The present disclosure is directed at meeting such need.

SUMMARY

In at least one aspect, the present disclosure relates to a method of performing oilfield operations at a wellsite. The wellsite is positioned about a subterranean formation having multiple wellbores therethrough and a fracture network therein, the fracture network comprising natural fractures. The method involves generating fracture parameters comprising a hydraulic fracture network of a fracture grid for each of the multiple wellbores based on wellsite data comprising microseismic events and a mechanical earth model, generating reservoir parameters comprising an updated mechanical earth model of a reservoir grid based on the wellsite data and the fracture parameters, generating integrated wellsite parameters comprising an integrated earth model by integrating the fracture parameters from the multiple wellbores with the reservoir parameters, and performing production operations at the multiple wellbores based on the integrated wellsite parameters.

In another aspect, the disclosure relates to a method of performing oilfield operations at a wellsite. The wellsite is positioned about a subterranean formation having multiple wellbores therethrough and a fracture network therein, the fracture network comprising natural fractures. The method involves collecting wellsite data comprising microseismic events and a mechanical earth model, generating fracture parameters comprising a hydraulic fracture network of a fracture grid for each of the multiple wellbores based on the wellsite data, generating reservoir parameters comprising an updated mechanical earth model of a reservoir grid based on the wellsite data and the fracture parameters, generating integrated wellsite parameters comprising an integrated earth model by gridding the fracture grid of the multiple wellbores with the reservoir grid, and performing production operations at the multiple wellbores based on the integrated wellsite parameters.

In yet another aspect, the disclosure relates to a method of performing oilfield operations at a wellsite. The wellsite is positioned about a subterranean formation having multiple wellbores therethrough and a fracture network therein, the fracture network comprising natural fractures. The method involves collecting wellsite data comprising microseismic events and a mechanical earth model, generating fracture parameters for each of the multiple wellbores based on the wellsite data, generating reservoir parameters comprising an updated mechanical earth model based on the wellsite data and the fracture parameters, integrating updated earth model by integrating the fracture parameters from the multiple wellbores with the updated earth model, generating integrated wellsite parameters based on the updated mechanical earth model, designing fracture operations based on the integrated wellsite parameters, and fracturing the wellsite according to the designed fracture operations.

Finally, in another aspect, the disclosure relates to methods and systems for determining production based on fractures generated from multiple wells. The method and system comprises running unstructured gridding algorithms on a multi-well hydraulically fractured infrastructure to capture the wells and hydraulic fracture systems accounting for production, and/or running numerical reservoir simulation on the unstructured grid model for the multi-well hydraulically fractured infrastructure to estimate production.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Embodiments of the system and method for generating a hydraulic fracture growth pattern are described with reference to the following figures. The figures are not necessarily to scale and certain features and certain views of the figures may be shown exaggerated in scale or in schematic in the interest of clarity and conciseness.

FIGS. 1.1-1.4 are schematic views illustrating various oilfield operations at a wellsite;

FIGS. 2.1-2.4 are schematic views of wellsite data collected by the operations of FIGS. 1.1-1.4;

FIG. 3.1 is a schematic view of a wellsite illustrating fracture operations for a fracture network in a subterranean formation;

FIG. 3.2 is a schematic diagrams illustrating microseismic monitoring of the fracture network;

FIGS. 4.1 and 4.2 are schematic diagrams depicting simulation workflows;

FIGS. 6.1-6.3 are schematic diagrams depicting integrated fracture modeling of the subterranean formation;

FIGS. 7.1 and 7.2 are graphs depicting gridding for multiple layers of the formation;

FIGS. 8.1 and 8.2 are schematic diagrams depicting views of a hydraulic fracture network overlaid onto a reservoir grid;

FIGS. 15.1 and 15.2 are plots depicting fracture conductivity for a modeled propped and unpropped fracture network, respectively; and FIG. 16 is a schematic diagram depicting an unstructured grid.

DETAILED DESCRIPTION

Figure 5:
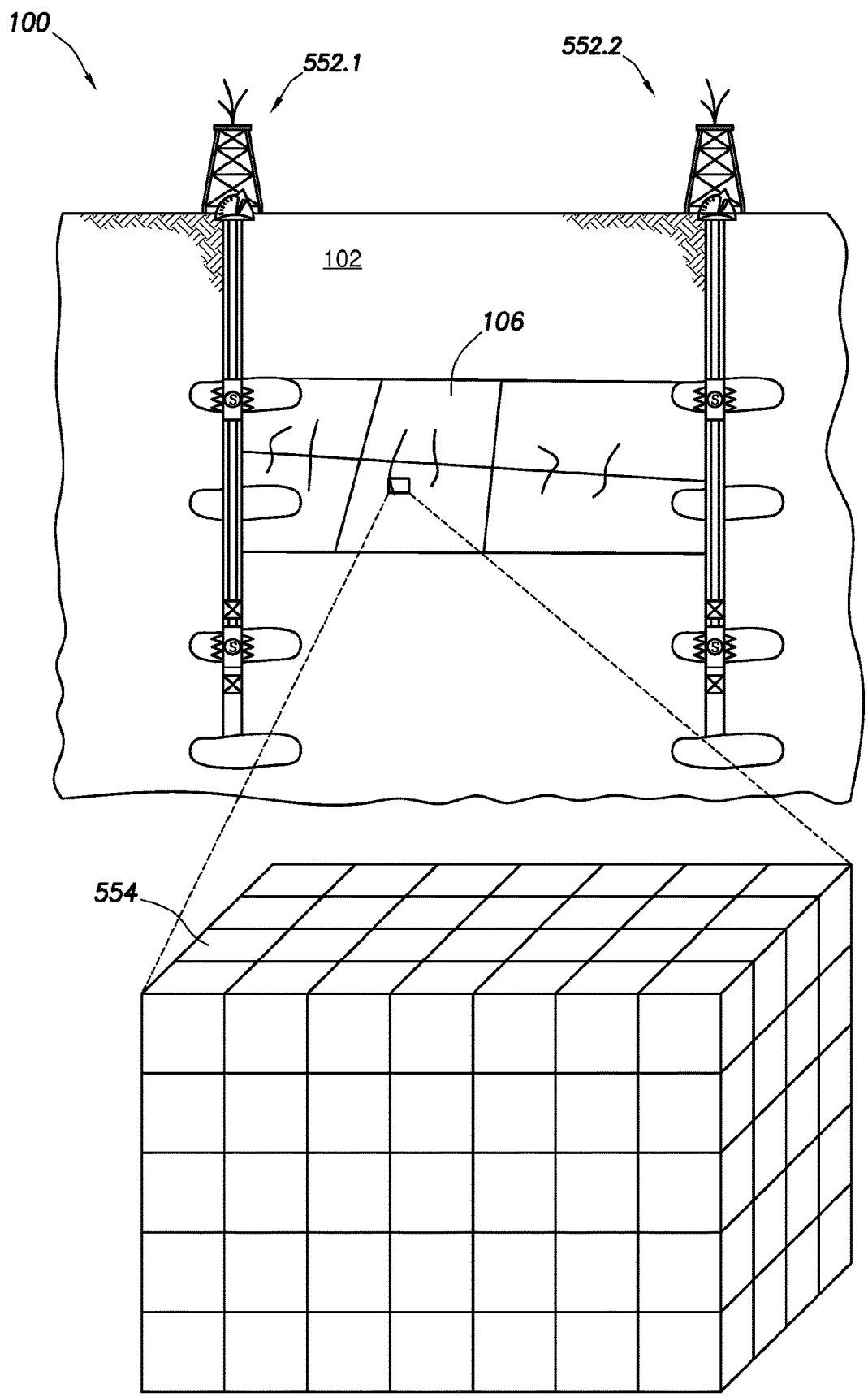
FIG. 5 is a schematic diagram of a wellsite showing multiple wellbores at a wellsite and a grid representing a portion of the subterranean formation.

The description that follows includes exemplary apparatuses, methods, techniques, and instruction sequences that embody techniques of the inventive subject matter. However, it is understood that the described embodiments may be practiced without these specific details.

The disclosure relates to methods and systems for designing oilfield operations, such as fracture and production operations. The methods seek to integrate operations of individual wells at the same wellsite to combine the effects of multiple wellbores on a formation. This involves integrating fracture simulations of the individual well with reservoir simulations of the same formation by applying the fracture simulations to reservoir grids. The integrated simulations incorporate fracture parameters (e.g., temperature, pressure, and fracture geometry) of separate wells with and reservoir parameters (e.g., pressure, flow rate, and permeability) to determine integrated production parameters (e.g., pressure, production flow rate, and permeability). The methods and systems may be performed using various simulators, such as a static (fracture) simulator (e.g., UFM™), a dynamic (reservoir) simulator (e.g., INTERSECT™ or ECLIPSE™) and/or a fracture simulator (e.g., MANGROVE™ and/or PETREL™). Modeling software and/or simulators that may be used, such as UFM™, INTERSECT™, ECLIPSE™, VISAGE™ MANGROVE™, and PETREL™, are commercially available from SCHLUMBERGER TECHNOLOGY CORPORATION™ at www.s-lb.com.

The integration of the simulators seeks to combine to predict the performance of multiple wells at the same wellsite (e.g., same pad) that are hydraulically fractured. Numerical gridding mechanisms and reservoir simulations may be created to predict the performance of multiple oil and gas wells which were hydraulically fractured on a pad. The workflow involves creating hydraulic fracture simulations on the wells, gridding the reservoir in an unstructured grid format and performing numerical simulation on the gridded system.

A method, apparatus, and program product is provided that utilizes a gridding algorithm and a reservoir simulator to perform production simulation for multi-well petroleum production pad system. By doing so, embodiments consistent with the disclosure can estimate well-to-well interference during production and also the interaction amongst the hydraulic fracture system in a multi-well context. The methods and systems described herein may be used to solve the problem of addressing factors which can affect create errors in predictions used to design oilfield operations by providing features to incorporate the effects of interactions between actions taken on separate wellbores to the entire wellsite. With these additional features, fracture and production design may be provided which consider interactions of the wellsite and are tailed according to realistic predictions of the effects of fracturing at the multiple wellbores.

Oilfield Operations

FIGS. 1.1-1.4 depict various oilfield operations that may be performed at a wellsite, and FIGS. 2.1-2.4 depict various information that may be collected at the wellsite. FIGS. 1.1-1.4 depict simplified, schematic views of a representative oilfield or wellsite 100 having subsurface formation 102 containing, for example, reservoir 104 therein and depicting various oilfield operations being performed on the wellsite 100. FIG. 1.1 depicts a survey operation being performed by a survey tool, such as seismic truck 106.1, to measure properties of the subsurface formation. The survey operation may be a seismic survey operation for producing sound vibrations. In FIG. 1.1, one such sound vibration 112 generated by a source 110 reflects off a plurality of horizons 114 in an earth formation 116. The sound vibration(s) 112 may be received by sensors, such as geophone-receivers 118, situated on the earth's surface, and the geophones 118 produce electrical output signals, referred to as data received 120 in FIG. 1.1.

In response to the received sound vibration(s) 112, and representative of different parameters (such as amplitude and/or frequency) of the sound vibration(s) 112, the geophones 118 may produce electrical output signals containing data concerning the subsurface formation. The data received 120 may be provided as input data to a computer 122.1 of the seismic truck 106.1, and responsive to the input data, the computer 122.1 may generate a seismic and microseismic (MSM) data output 124. The seismic data output may be stored, transmitted or further processed as desired, for example by data reduction.

FIG. 1.2 depicts a drilling operation being performed by a drilling tool 106.2 suspended by a rig 128 and advanced into the subsurface formations 102 to form a wellbore 136 or other channel. A mud pit 130 may be used to draw drilling mud into the drilling tools 106.2 via flow line 132 for circulating drilling mud through the drilling tools 106.2, up the wellbore 136 and back to the surface. The drilling mud may be filtered and returned to the mud pit. A circulating system may be used for storing, controlling or filtering the flowing drilling muds. In this illustration, the drilling tools are advanced into the subsurface formations to reach reservoir 104. Each well may target one or more reservoirs. The drilling tools 106.2 may be adapted for measuring downhole properties using logging while drilling tools. The logging while drilling tool may also be adapted for taking a core sample 133 as shown, or removed so that a core sample may be taken using another tool.

A surface unit 134 may be used to communicate with the drilling tools and/or offsite operations. The surface unit may communicate with the drilling tools to send commands to the drilling tools 106.2, and to receive data therefrom. The surface unit may be provided with computer facilities for receiving, storing, processing, and/or analyzing data from the operation. The surface unit 134 may collect data generated during the drilling operation and produce data output 135 which may be stored or transmitted. Computer facilities, such as those of the surface unit 134, may be positioned at various locations about the wellsite and/or at remote locations.

Sensors (S), such as gauges, may be positioned about the oilfield to collect data relating to various operations as described previously. As shown, the sensor (S) may be positioned in one or more locations in the drilling tools 106.2 and/or at the rig 128 to measure drilling parameters, such as weight on bit, torque on bit, pressures, temperatures, flow rates, compositions, rotary speed and/or other parameters of the operation. Sensors (S) may also be positioned in one or more locations in the circulating system.

The data gathered by the sensors (S) may be collected by the surface unit 134 and/or other data collection sources for analysis or other processing. The data collected by the sensors (S) may be used alone or in combination with other data. The data may be collected in one or more databases and/or transmitted on or offsite. All or select portions of the data may be selectively used for analyzing and/or predicting operations of the current and/or other wellbores. The data may be historical data, real time data or combinations thereof. The real time data may be used in real time, or stored for later use. The data may also be combined with historical data or other inputs for further analysis. The data may be stored in separate databases, or combined into a single database.

The collected data may be used to perform analysis, such as modeling operations. For example, the seismic data output may be used to perform geological, geophysical, and/or reservoir engineering analysis. The reservoir, wellbore, surface and/or processed data may be used to perform reservoir, wellbore, geological, and geophysical or other simulations. The data outputs from the operation may be generated directly from the sensors, or after some preprocessing or modeling. These data outputs may act as inputs for further analysis.

The data may be collected and stored at the surface unit 134. One or more surface units 134 may be located at the wellsite, or connected remotely thereto. The surface unit 134 may be a single unit, or a complex network of units used to perform the data management functions throughout the oilfield. The surface unit 134 may be a manual or automatic system. The surface unit 134 may be operated and/or adjusted by a user.

The surface unit may be provided with a transceiver 137 to allow communications between the surface unit 134 and various portions of the current oilfield or other locations. The surface unit 134 may also be provided with or functionally connected to one or more controllers for actuating mechanisms at the wellsite 100. The surface unit 134 may then send command signals to the oilfield in response to data received. The surface unit 134 may receive commands via the transceiver 137 or may itself execute commands to the controller. A processor may be provided to analyze the data (locally or remotely), make the decisions and/or actuate the controller. In this manner, operations may be selectively adjusted based on the data collected. Portions of the operation, such as controlling drilling, weight on bit, pump rates or other parameters, may be optimized based on the information. These adjustments may be made automatically based on computer protocol, and/or manually by an operator. In some cases, well plans may be adjusted to select optimum operating conditions, or to avoid problems.

FIG. 1.3 depicts a wireline operation being performed by a wireline tool 106.3 suspended by the rig 128 and into the wellbore 136 of FIG. 1.2. The wireline tool 106.3 may be adapted for deployment into a wellbore 136 for generating well logs, performing downhole tests and/or collecting samples. The wireline tool 106.3 may be used to provide another method and apparatus for performing a seismic survey operation. The wireline tool 106.3 of FIG. 1.3 may, for example, have an explosive, radioactive, electrical, or acoustic energy source 144 that sends and/or receives electrical signals to the surrounding subsurface formations 102 and fluids therein.

The wireline tool 106.3 may be operatively connected to, for example, the geophones 118 and the computer 122.1 of the seismic truck 106.1 of FIG. 1.1. The wireline tool 106.3 may also provide data to the surface unit 134. The surface unit 134 may collect data generated during the wireline operation and produce data output 135 which may be stored or transmitted. The wireline tool 106.3 may be positioned at various depths in the wellbore 136 to provide a survey or other information relating to the subsurface formation.

Sensors (S), such as gauges, may be positioned about the wellsite 100 to collect data relating to various operations as described previously. As shown, the sensor (S) is positioned in the wireline tool 106.3 to measure downhole parameters which relate to, for example porosity, permeability, fluid composition and/or other parameters of the operation.

FIG. 1.4 depicts a production operation being performed by a production tool 106.4 deployed from a production unit or Christmas tree 129 and into the completed wellbore 136 of FIG. 1.3 for drawing fluid from the downhole reservoirs into surface facilities 142. Fluid flows from reservoir 104 through perforations in the casing (not shown) and into the production tool 106.4 in the wellbore 136 and to the surface facilities 142 via a gathering network 146.

Sensors (S), such as gauges, may be positioned about the oilfield to collect data relating to various operations as described previously. As shown, the sensor (S) may be positioned in the production tool 106.4 or associated equipment, such as the Christmas tree 129, gathering network 146, surface facilities 142 and/or the production facility, to measure fluid parameters, such as fluid composition, flow rates, pressures, temperatures, and/or other parameters of the production operation.

While simplified wellsite configurations are shown, it will be appreciated that the oilfield or wellsite 100 may cover a portion of land, sea and/or water locations that hosts one or more wellsites. Production may also include injection wells (not shown) for added recovery or for storage of hydrocarbons, carbon dioxide, or water, for example. One or more gathering facilities may be operatively connected to one or more of the wellsites for selectively collecting downhole fluids from the wellsite(s).

It should be appreciated that FIGS. 1.1-1.4 depict tools that can be used to measure not only properties of an oilfield, but also properties of non-oilfield operations, such as mines, aquifers, storage, and other subsurface facilities. Also, while certain data acquisition tools are depicted, it will be appreciated that various measurement tools (e.g., wireline, measurement while drilling (MWD), logging while drilling (LWD), core sample, etc.) capable of sensing parameters, such as seismic two-way travel time, density, resistivity, production rate, etc., of the subsurface formation and/or its geological formations may be used. Various sensors (S) may be located at various positions along the wellbore and/or the monitoring tools to collect and/or monitor the desired data. Other sources of data may also be provided from offsite locations.

The oilfield configuration of FIGS. 1.1-1.4 depict examples of a wellsite 100 and various operations usable with the techniques provided herein. Part, or all, of the oilfield may be on land, water and/or sea. Also, while a single oilfield measured at a single location is depicted, reservoir engineering may be utilized with any combination of one or more oilfields, one or more processing facilities, and one or more wellsites.

FIGS. 2.1-2.4 are graphical depictions of examples of data collected by the tools of FIGS. 1.1-1.4, respectively. FIG. 2.1 depicts a seismic trace 202 of the subsurface formation of FIG. 1.1 taken by seismic truck 106.1. The seismic trace 202 may be used to provide data, such as a two-way response over a period of time. FIG. 2.2 depicts a core sample 133 taken by the drilling tools 106.2. The core sample may be used to provide data, such as a graph of the density, porosity, permeability or other physical property of the core sample over the length of the core. Tests for density and viscosity may be performed on the fluids in the core at varying pressures and temperatures. FIG. 2.3 depicts a well log 204 of the subsurface formation of FIG. 1.3 taken by the wireline tool 106.3. The wireline log may provide a resistivity or other measurement of the formation at various depths. FIG. 2.4 depicts a production decline curve or graph 206 of fluid flowing through the subsurface formation of FIG. 1.4 measured at the surface facilities 142. The production decline curve may provide the production rate Q as a function of time t.

The respective graphs of FIGS. 2.1, 2.2, and 2.3 depict examples of static measurements that may describe or provide information about the physical characteristics of the formation and reservoirs contained therein. These measurements may be analyzed to define properties of the formation(s), to determine the accuracy of the measurements and/or to check for errors. The plots of each of the respective measurements may be aligned and scaled for comparison and verification of the properties.

FIG. 2.4 depicts an example of a dynamic measurement of the fluid properties through the wellbore. As the fluid flows through the wellbore, measurements are taken of fluid properties, such as flow rates, pressures, composition, etc. As described below, the fracture and reservoir measurements may be analyzed and used to generate models of the subsurface formation to determine characteristics thereof. Similar measurements may also be used to measure changes in formation aspects over time.

FIGS. 3.1 and 3.2 show example fracture operations that may be performed about the wellsite 100. The oilfield configurations of FIGS. 3.1-3.2 depict examples of the wellsite 100 and various operations usable with the techniques provided herein. FIG. 3.1 shows an example fracture operation at the wellsite 100 involving the injection of fluids into the wellbore 136 in the subterranean formation 302 to expand the fracture network 306 propagated therein. The wellbore 136 extends from a wellhead 308 at a surface location and through the subterranean formation 302 therebelow. The fracture network 306 extends about the wellbore 136. The fracture network 306 includes various fractures positioned about the formation, such as natural fractures 305, as well as hydraulic fractures 307 created during fracturing.

Fracturing is performed by pumping fluid into the formation using a pump system 329. The pump system 329 is positioned about the wellhead 308 for passing fluid through a fracture tool (e.g., tubing) 342. The pump system 329 is depicted as being operated by a field operator 327 for recording maintenance and operational data and/or performing maintenance in accordance with a prescribed maintenance plan. The pumping system 329 pumps fluid from the surface to the wellbore 136 during the fracture operation.

The pump system 329 includes a plurality of water tanks 331, which feed water to a gel hydration unit 333. The gel hydration unit 333 combines water from the tanks 331 with a gelling agent to form a gel. The gel is then sent to a blender 335 where it is mixed with a proppant (e.g., sand or other particles) from a proppant transport 337 to form a fracturing (or injection) fluid. The gelling agent may be used to increase the viscosity of the fracturing fluid, and to allow the proppant to be suspended in the fracturing fluid. It may also act as a friction reducing agent to allow higher pump rates with less frictional pressure.

The fracturing fluid is then pumped from the blender 335 to the treatment trucks 320 with plunger pumps as shown by solid lines 343. Each treatment truck 320 receives the fracturing fluid at a low pressure and discharges it to a common manifold 339 (sometimes called a missile trailer or missile) at a high pressure as shown by dashed lines 341. The missile 339 then directs the fracturing fluid from the treatment trucks 320 to the wellbore 136 as shown by solid line 315. One or more treatment trucks 320 may be used to supply fracturing fluid at a desired rate.

Each treatment truck 320 may be normally operated at any rate, such as well under its maximum operating capacity. Operating the treatment trucks 320 under their operating capacity may allow for one to fail and the remaining to be run at a higher speed in order to make up for the absence of the failed pump. A computerized control system may be employed to direct the entire pump system 329 during the fracturing operation.

Various fluids, such as conventional stimulation fluids with proppants (slurry), may be pumped into the formation through perforations along the wellbore to create fractures. Other fluids, such as viscous gels, "slick water" (which may have a friction reducer (polymer) and water) may also be used to hydraulically fracture shale gas wells. Such "slick water" may be in the form of a thin fluid (e.g., nearly the same viscosity as water) and may be used to create more complex fractures, such as multiple micro-seismic fractures detectable by monitoring.

During a fracture treatment, sufficient pad fluid (injection fluid without proppant) may be first pumped to create a sufficiently long fracture to provide effective enhancement to the reservoir flow, followed by slurry to fill the fracture with proppant suspended in the carrier fluid. As pumping ceases, the fluid in the slurry gradually leaks off into the formation, leaving the proppant in the fracture to provide a highly conductive channel to enhance the hydrocarbon production into the well.

Fracture operations may be designed to facilitate production from the wellsite. In particular, injection may be manipulated by adjusting the material being injected and/or the way it is injected to achieve the fractures which draws fluid from formations into the wellbore and up to the surface. When a fluid is pumped into a formation at a high rate, the natural permeability of the formation may not be sufficient to accept the injected fluid without requiring extremely high injection pressure, which may lead to the fluid pressure exceeding the minimum in-situ stress to create one or more tensile fractures from the wellbore or perforations. Once a tensile fracture is initiated, the fracture faces may separate and the fracture front may propagate away from the injection point, increasing the fracture length, height and width to create the storage volume for the injected fluid. In order to design the fracture treatment with effective fracture operations to achieve the desired fractures, methods described herein seek to capture the fundamental physics of the fracturing process as is described further herein.

As also shown in FIG. 3.1 (as well as FIGS. 1.1-1.4), the wellsite 100 may be provided with sensors (S) to measure wellsite parameters, such as formation parameters (e.g., mechanical properties, petrophysical properties, geological structure, stresses, in situ stress distribution, permeability, porosity, natural fracture geometry, etc.), fracture parameters (e.g., pump rate, volume (e.g., pad fluid and slurry), fracture geometry (e.g., propped fracture length), concentration of the proppant etc.), fluid parameters (e.g., viscosity, composition, proppant, temperature, density, etc.), reservoir parameters (e.g., pressure, temperature, viscosity), equipment parameters, and/or other parameters as desired. The sensors (S) may be gauges or other devices positioned about the oilfield to collect data relating to the various operations. Various sensors (S) may be located at various positions along the wellbore and/or the monitoring tools to collect and/or monitor the desired data. Other sources of data may also be provided from offsite locations.

As schematically shown in FIG. 3.1, the sensors S may be part of or include a geophone 347 in an adjacent wellbore 346 and/or a logging tool 349 in the wellbore 136 for measuring seismic activity of the wellsite. The geophone 347, logging tool 349, and/or other tools may be used to generate seismic data that may be used to detect microseismic events 348 about the fracture network 306 as shown in FIG. 3.2. These events 348 may be mapped using conventional techniques to determine fracture parameters, such as fracture geometry.

Oilfield Simulation

Oilfield simulations may be used to perform modeled oilfield operations before equipment is deployed and actions are taken at the wellsite. Based on such simulations, adjustments may be made in the operations to generate optimal results and/or to address potential problems that may occur. Examples of simulation software that are used in the oilfield to simulate oilfield operations include MANGROVE™ and PETREL™ (or PETREL™ E&P). Oilfield software, such as PETREL™, may be used as a platform for supporting various aspects of oilfield simulation, such as fracture and/or production simulations.

Fracture simulation software, such as MANGROVE™, may be used to simulate fracture operations (or engineered stimulation design) alone or within the software platform. For example, fracture simulators may be used to integrate seamlessly with comprehensive seismic-to-simulation workflows in both conventional and unconventional reservoirs. The fracture simulator may be used, for example, to tell operators and users where to place fracturing stages, how hydraulic fractures interact with natural fractures, where fluid and proppant are in the fractures is, and how much the wells will produce in time.

The present disclosure seeks to integrate fracture stimulation design provided by fracture simulators, such as MANGROVE™, with seismic, geological, geophysical, geomechanical, petrophysical, microseismic fracture mapping, and reservoir engineering provided in the software platform. Wellsite parameters, such as formation characteristics, rock compressive strength, and regional stress patterns—three factors affecting fracture geometry, may be taken into account for the stimulation design. The fracture simulators may estimate, for example, fluid and proppant placement in the sub-surface rock.

Hydraulic fracture network dimensions and reservoir penetration may be based on detailed rock fabric characteristics and geomechanical properties along with treatment properties, such as fluid rheology, leakoff, permeability, and closure stress. After fracture design is completed, it may be coupled to the reservoir simulation in a seamless manner to allow operators to optimize the treatments for maximized productivity. MANGROVE™ stimulation design is a fracturing model platform that enables automated unstructured gridding to model complex hydraulic fractures for reservoir simulation. The reservoir simulator (e.g., INTERSECT™) may be coupled to the hydraulic fracture models (e.g., in MANGROVE™) providing a smooth link from completion to reservoir engineering. Examples of modeling using MANGROVE™ are provided in U.S. Pat. No. 9,228,425, the entire contents of which are hereby incorporated by reference herein.

FIGS. 4.1 and 4.2 show example embodiments of simulation workflows 400.1, 400.2. FIG. 4.1 shows an integrated seismic to simulation workflow 400.1 that may be used for well completions, fracture design and production evaluation. The workflow 400.1 combines separate work flows 450.1-450.8 for structure lithology, discrete fracture network, geomechanical model, staging and perforating, complex hydraulic fracture models, microseismic mapping, automated gridding, and reservoir simulation, respectively.

FIG. 4.2 shows another example workflow 400.2. As schematically shown, the workflow 400.2 includes events 451.1-451.7 of a hydraulic fracture workflow, such as one used in MANGROVE™. The events include 451.1 creating a geological model with reservoir and rock properties, 451.2 designing completions (e.g., stages, perforations), 451.3 performing hydraulic fracture simulations (e.g., for planar and complex fractures), 451.4 matching microseismic and/or treatment data, 451.5 creating grids for reservoir simulation input (e.g., structure and unstructured grids), 451.6 running reservoir simulation (e.g., prediction and history match), and 451.7 performing uncertainty optimization (e.g., number of wells, stages, stimulation design, location and placement, reservoir characterization).

In general, the oil and gas reservoirs can be heterogeneous and have varied properties across the wellsite. Some of them may have medium to high permeability and some may have low permeability that does not produce, or may have low production after drilling the wellbore. Hydraulic fracturing has become a useful tool to extract oil and gas at economic rates from some of these complex, low permeability reservoirs. An example workflow for using simulations to design operations to facilitate production is depicted in FIG. 4.2.

In the hydraulic fracturing workflow 400.2, a geological model (or MEM) may be created with a definition of the structural lithology and reservoir parameters, such as permeability, porosity, fluid saturation distribution, and rock properties, such as minimum in-situ stress, Young's modulus, etc. If the formation is naturally fractured, then the geological model can also involve defining the location, length and azimuth of these natural fractures in the reservoir.

After the geological model is ready, well completion may be designed which may be apt and useful for the treatment execution for the conditions defined by the geological model. The well completion design may involve the segmentation of the wellbore into one or more stages in order to cover a pay section through one or multiple stages of hydraulic fracturing treatments. Apart from segmentation of the wellbore into one or more stages, the location of the actual perforations to be done may be identified at this stage, such that the hydraulic fractures may successfully initiate in these perforations and propagate to cover the desired pay section.

Achieving an optimal number and location of fracture treatment stages and perforation clusters may be a manual, time-intensive task. In tight reservoirs, the placement of perforation clusters may be done geometrically, without regard for variations in rock quality along the lateral. Simulators, such as MANGROVE™'s completion advisor module, may allow users to run mathematical algorithms to design the stages and perforations in an automated technique. The algorithms utilize detailed geomechanical, petrophysical, and geological data to select stage intervals and perforation locations. Based on criteria for reservoir and completion quality measurements provided by one skilled in the art, sweet spots for perforation clusters may be identified. Furthermore, respecting the user-provided reservoir, operational, and structural constraints, stages may be defined to keep rocks with similar reservoir properties together.

The design of the hydraulic fracture in the workflow involves creating treatment design scenarios with actual treatment fluid and proppant schedules. The simulation models may then run on these schedules to predict the fracture propagation, fluid and proppant placement and the ultimate fracture geometry achieved.

Simulators (e.g., MANGROVE™) may have built-in unconventional hydraulic fracture models like UFM™ (or other unconventional fracture models) to take into account the rock geomechanics and interaction of natural fractures in predicting the complex fracture geometry. Planar fracture models are also available for application in simple and non-complex cases where there is an absence of natural fractures in the reservoir.

Once the treatment is executed on the wellsite, the treatment data (e.g., treatment pressure, proppant concentration, pumping rates and microseismic hydraulic fracture monitoring data) can be used to re-calibrate the stimulation design model by matching the observed parameters against the predicted parameters from the simulation run. The matching exercise may require changing the reservoir properties in the geological model and/or changing the fracture design parameters and fluid properties.

Once a reasonable match of the predicted versus observed data is attained, the hydraulic fractures and the reservoirs may be gridded in structured or unstructured reservoir grids which serve as input for the reservoir simulation. The reservoir simulation may comprise either a production or a history match of the production data.

The same treatment design may be applied to a number of wells in a field or part of the field, and the treatment revised to achieve an optimum design that provides the maximum net present value. The fracture parameters for single stage or multiple stage and single well or multiple wells are then optimized. Examples of such fracture parameters may be volume of fracturing fluid, fracturing proppants, number of stages that are to be hydraulically fractured, location and placement of the wellbore, etc.

Integrated Multi-Wellbore Operations

Reservoir simulators (e.g., INTERSECT™ or ECLIPSE™) with unstructured grid capabilities may be used to predict hydrocarbon (gas and/or oil) production. By applying modeled fractures of multiple wells to the unstructured grid, the hydraulic fracture properties may be upscaled into the base reservoir grid. Additionally, the fracture properties associated with multiple wellbores may be applied to the reservoir grid of a common formation. The integration of fracture models with reservoir models seeks to preserve the accuracy of both the modeled hydraulic fracture network as well as the static reservoir model (as background).

The methods herein seek to provide techniques for integrating various aspects of the oilfield operation from multiple wellbores, such as those shown in FIG. 5. FIG. 5 schematically depicts wellbores 552.1, 552.2 at a wellsite 100. The wellbores may extend into the formation 102 with a fracture network 106 therein. The fracture network 106 includes natural fractures naturally occurring within the subterranean formation, as well as hydraulic fractures generated by injection of an injection fluid into the formation as described, for example, in FIG. 3.1. Injection from each of the wellbores 552.1, 552.2 into the subterranean formation 102 affects the fracture network 106 therein.

The hydraulic fractures propagated during fracturing of the fracture network is a complex process that can be modeled through a fracture model, such as UFM™ and/or MANGROVE™ Natural fracture reactivation and shear slippage may be possible when it meets induced hydraulic fractures. The interaction between the hydraulic fractures with the natural fractures may result in the generation of microseismic events when the hydraulic fracture treatment is pumped into the reservoir. The following US patents and PCT Patent Applications disclose aspects of this modeling, among other things, and each of the following are incorporated by reference herein in their entireties: U.S. Pat. No. 8,412,500; PCT/US2014/064205; Ser. Nos. 14/350,533; 14/664,362; U.S. Pat. No. 7,784,544; Ser. Nos. 12/462,244; 13/517,007; 14/004,612; 14/126,201; 14/356,369; 13/968,648; 14/423,235;PCT/US2013/076765; PCT/US2014/045182; U.S. Pat. Nos. 8,280,709; and 8,271,243.

The reservoir may be modeled using a reservoir simulation, such as INTERSECT™ and/or ECLIPSE™. Reservoir simulation may be performed using gridding techniques, such as those described in U.S. Pat. No. 7,716,029, the entire contents of which is hereby incorporated by reference herein. A grid 554 may be formed to simulate fluid flow through the formation as schematically shown in FIG. 5.

The fracture network 106 is affected by oilfield operations, such as drilling, injection, etc., performed from each of the wellbore. Such operations apply forces to the formation from different directions, thereby resulting in a combined effect upon the fracture network 106. FIGS. 6.1-6.3 depict various examples of simulations that may be performed for a pair of wellbores 652.1, 652.2 at a wellsite 604. FIG. 6.1 depicts a reservoir model of a wellsite with two wellbores. FIG. 6.2 show a hydraulic fracture network simulated about the two wellbores. FIG. 6.3 depicts a fracture network applied to a reservoir simulator for the two wellbores.

FIG. 6.1 is a schematic example of a 3D reservoir model 600.1 looking down at the wellbores 652.1, 652.2 from the surface. The reservoir model 600.1 shows perforations 656.1, 656.2 along the wellbores. The reservoir model 600.1 is gridded into 3D orthogonal lattices to form a grid 654.1 about the formation. The formation has k-layers therein (not shown in this view). The reservoir model 600.1 may be generated using a reservoir simulator, such as INTERSECT™, ECLIPSE™, and/or MANGROVE™.

Wellsite data may be input into the reservoir to define the reservoir model 600.1. For example, surface outcrop observations, seismic surveys, wireline logs, and logging-while-drilling logs, may collectively contribute in the hydrocarbon reservoir characterization process. Initial steps may involve identifying subsurface structures, such as seismic or geological surfaces and faults. Petrophysical properties, such as porosity, permeability, and water saturations, and geomechanical properties, such as stress, Young's modulus, and Poisson's ratio, may be derived from seismic and well logs and distributed over the grid 654.1. This grid 654.1 forms a static reservoir model (i.e., a steady state model). Well drilling and the hydraulic fracturing process, by injecting high pressured fluids with proppants, adds a fluid migration path(s) into this static system. As a result, a migration (flow) of hydrocarbon and water over the time of well production phase dynamically change the initial static properties.

FIG. 6.2 is a plot of a fracture model (or simulation) 600.2 of hydraulic fracture network 645.1, 645.2 generated about each of the wellbores 652.1, 652.2 by injection of injection fluid into the formation (i.e., stimulation). Using known wellsite data, the hydraulic fracture model 600 may be generated using a fracture simulator, such as UFM™, to predict geometry of fractures in the hydraulic fracture networks and the distribution of fluids and proppants therein.

Parameters within each portion of the hydraulic fracture networks may be determined. For example, a portion of the hydraulic fracture network where fracturing fluid occupies and a portion of the hydraulic fracture network where both fracturing fluid and proppant occupies each have specific fluid parameters, such as fluid and proppant specific conductivity (i.e. permeability). In low permeable reservoir rock (e.g., in the case of unconventional reservoir), this hydraulic fracture network provides a hydrocarbon conduit due to its increased permeability across fracture network of the formation. These fluid properties may be considered in determining behavior of the fracture and/or reservoir.

FIG. 6.3 is a plot combining the reservoir simulation 600.1 with the fracture simulation 600.2 to generate an integrated reservoir/fracture model 600.3. The fracture simulation 600.2 of FIG. 6.2 may include a gridded fracture generated from the fracture simulator (e.g., MANGROVE™). The gridded fracture is applied to the gridded reservoir simulation 600.1 by inputting the gridded fracture into the reservoir simulator. As shown, the fracture networks 645.1, 645.2 and portions of the reservoir grid 654.1 around the fracture network 645.1, 645.2 are altered, thereby resulting in a modified reservoir grid 654.1 and modified fracture networks 645.1', 645.2'. The integrated reservoir/fracture model 600.3 honors the geometry of predicted (simulated) hydraulic fracture network, and super imposes the fracture networks 645.1', 645.2' on top of the reservoir grid 654.1'.

The integration provided in FIGS. 6.1-8.2 may involve combining inputs from the fracture simulator and the reservoir simulator, for example, by collecting wellsite data for gridding into both the fracture simulator and the reservoir simulator. Each of the simulators may have processors and databases to collect and process the wellsite data and generate the simulator outputs (e.g., FIGS. 6.1-6.3).

The simulator outputs may be combined and processed in a common or separate database and a processor integrated for use in designing fracture and production operations (e.g., in MANGROVE™). The combination of the outputs from the fracture simulator and the reservoir simulator may be achieved by integrating the data from each simulator in a manner that honors underlying features of the separate simulators while providing a means for combining the results. This process may be used to integrate fracture and reservoir features in a manner that provides a meaningful representation of the wellsite, and/or that may be used in designing/optimizing oilfield operations.

The integration of the models into an integrated model 600.3 is schematically depicted in FIGS. 7.1-8.2 of one of the wellbores 652.1. FIGS. 7.1 and 7.2 schematically depict adjustment of the 2D grid 654.1 about the wellbores 652.1. Pay layers 658.1, 658.2 are depicted along the grid to show where fluid flow is likely to occur. These figures also schematically show fluid and proppant flow in a vertical direction through k-layers of the formation 602 in a z (vertical) direction. The k-layers from the input reservoir grid is preserved.

The hydraulic fracture geometry generated by the fracture simulation 600.2 may be input into the reservoir grid 654.1 in a lateral direction (i.e., x-y plane). The fracture network geometry and property distribution is shown in the vertical direction. This is used to identify fluid penetration (N), boundaries of fracture height (fluid front), and the level of proppant settlement (Sp). Additional vertical layers 657.3 are defined based on these boundaries. This process may be repeated for each and every branch of the simulated hydraulic fracture network 645.1.

FIGS. 8.1 and 8.2 show superimposition of the fracture network 645.1 onto the reservoir grid 654.1. FIG. 8.1 shows another view of the reservoir grid with the hydraulic fracture network thereon in a complex unstructured grid format. Properties from reservoir grid as well as from hydraulic fracture network are mapped to generate the combined simulation 600.3 as in FIG. 3. More information about gridding is provided further herein with respect to FIGS. 15.1, 15.2, and 16.

As also shown in FIG. 8.1, the fracture is shaded to indicate proppant placement. The wellbore 604 is also schematically shown with perforation clusters 656.1 positioned along the wellbore 604 for injection of fluids. FIG. 8.2 shows a simulation 600.4 depicting in-situ horizontal stressed mapped onto the reservoir grid 654.1. This simulation 600.4 shows a 3D version of the simulated hydraulic fracture network 645.1''' applied to the grid 654.1'''. Perforation clusters 656.1 and 656.2 are also shown.

Figure 9:
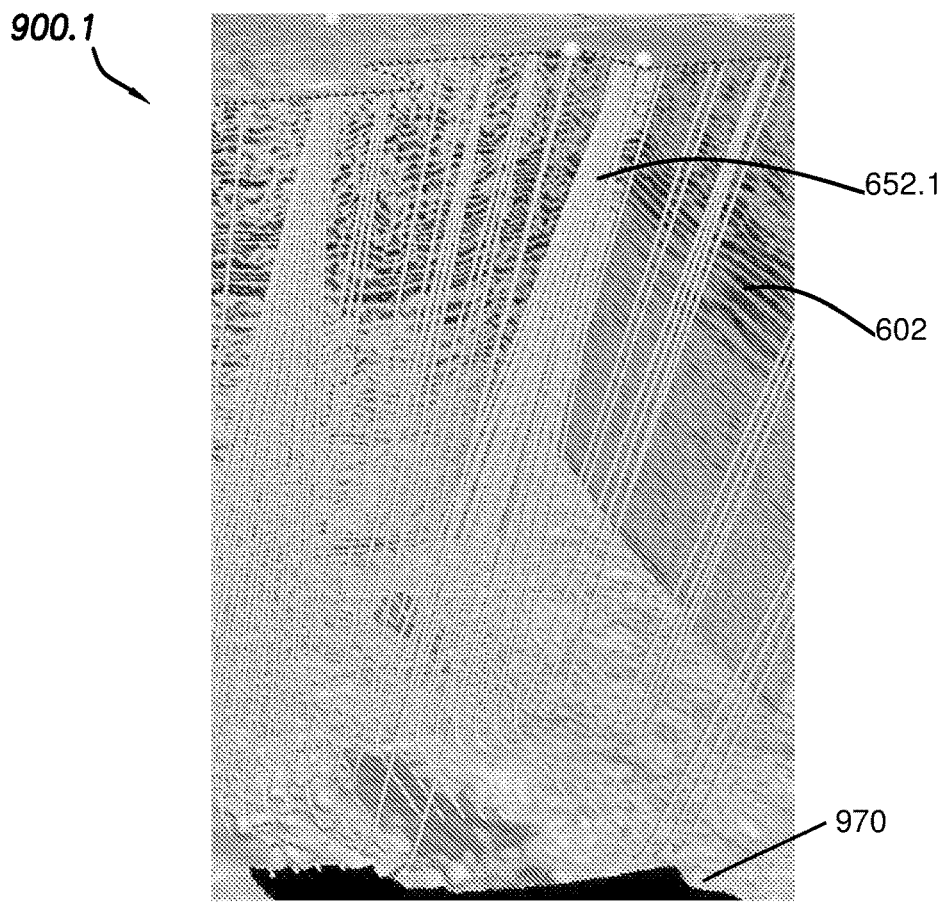
FIG. 9 is a simulation depicting production simulation for multiple wellbores at a wellsite.
Figure 10:
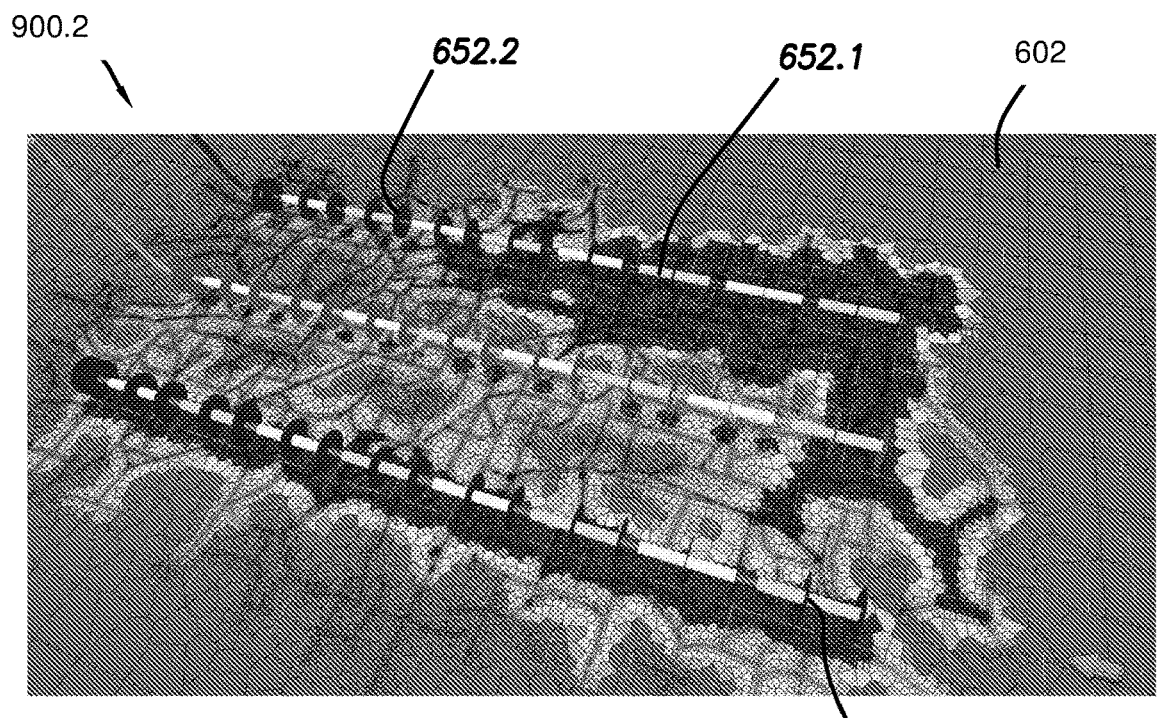
FIG. 10 is a simulation depicting interactions of multiple wellbores at a wellsite.

FIGS. 9 and 10 show simulations 900.1, 900.2. FIG. 9 shows multiple wellbores extending into the subterranean formation 602 to reach reservoirs 970 therein. As shown, multiple wellbores may extend through different portions of the same formations 602 of a wellsite pad to reach the same or different reservoirs 970.

FIG. 10 shows interactions between multiple wellbores 652.1-652.3 in adjacent portions of the subterranean formation 602. As shown by these views, hydraulic fracture networks generated from perforations from each wellbore may impact the same portions of the formation 602, thereby causing a combined effect to the formation. The interaction of the fractures from different wells may provide a combined impact that may be different from the impact resulting from fracturing about any one of the wellbores. The present disclosure seeks to provide methods to address the interactions resulting from fracturing about multiple wellbores.

Figure 11:
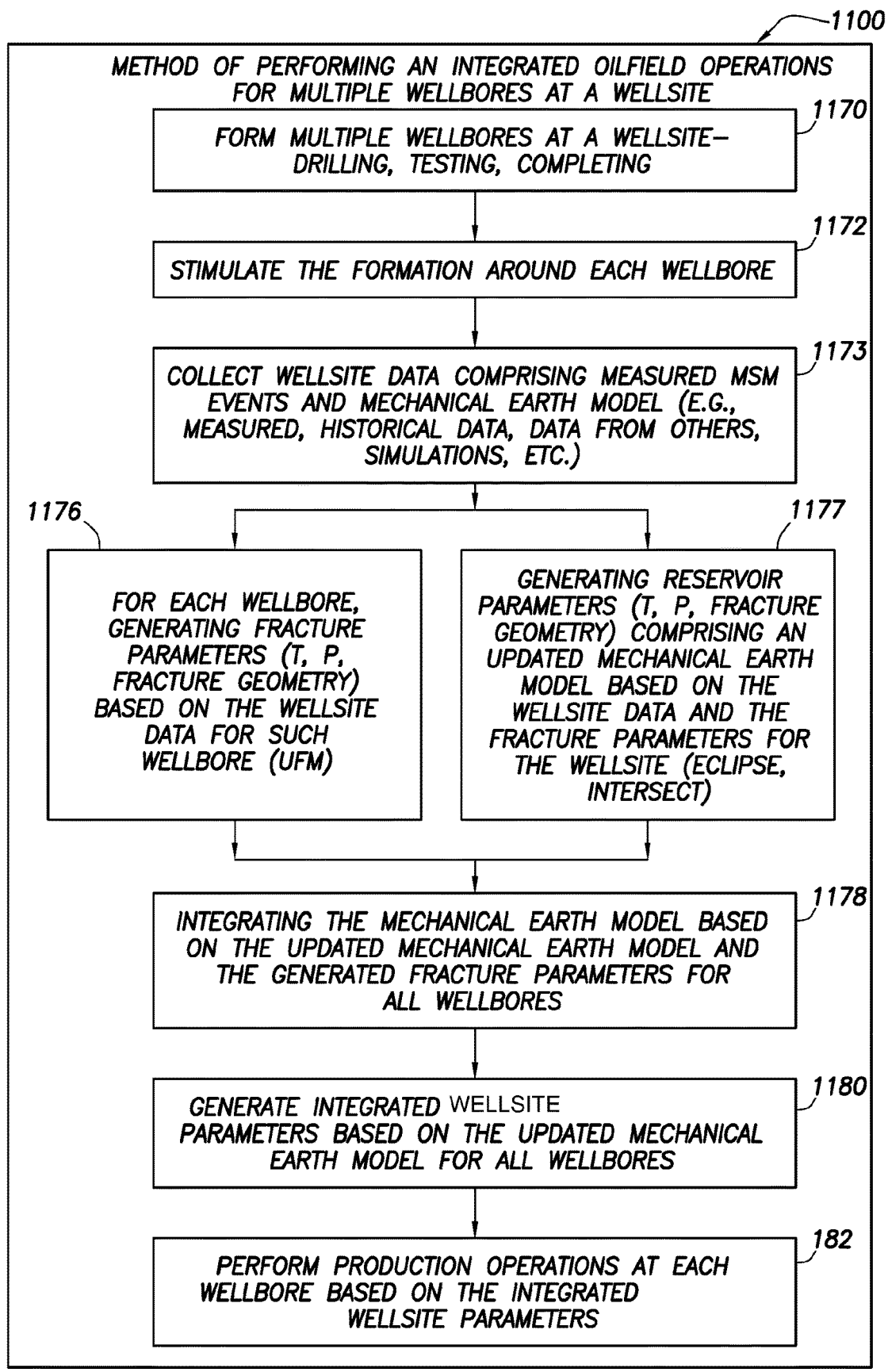
FIG. 11 is a flow chart depicting a method of performing integrated oilfield operations for multiple wellbores at a wellsite.

FIG. 11 is a flow chart depicting a method 1100 for performing integrated oilfield operation at a wellsite. The method 1100 may be used to integrate interactions caused by oilfield operations performed by multiple wellbores at a wellsite. The method 1100 involves 1170 various oilfield operations, such as forming multiple wellbores at a wellsite (e.g., by drilling, testing, completing, etc.), and 1172 stimulating the formation around each wellbore (e.g., perforating, injecting). The method also involves 1173 collecting wellsite data, such as the data depicted in FIGS. 1.1-3.4. The wellsite data may be collected before, during, and after one or more oilfield operations.

Examples of data that may be collected include historical data, data from third parties, measured data, simulated or estimated data, observations, etc. The wellsite data may include, for example, mechanical properties, petrophysical properties, geological structure, stresses, in situ stress distribution, permeability, porosity, natural fracture geometry, etc. The wellsite data may include fracture parameters, such as perforation clusters, stages of pumping, pumping rates, fracturing fluid types, fluid viscosity, proppant type, treating pressures, surface fluid temperatures and rock properties. These fracture parameters may provide information to determine the hydraulic fracture propagation as shown, for example, in FIG. 6.2. Such data may be gathered from historical, customer, other wellsites, measurements, and/or other sources. Computerized systems may be available on the wellsite to collect real-time measurements and information about the pumping job. The collected data may include seismic (and/or microseismic) data measured at the wellsite, such as logging data and/or data measured using geophones. Such seismic data may be mapped as shown in FIG. 3.4.

The wellsite may also include a mechanical earth model (MEM). The MEM may be a model that is provided, or may be calculated from the other wellsite data. The MEM is a numerical representation of the geomechanical state of the wellsite (e.g., reservoir, field, and/or basin). In addition to property distribution (e.g., density, porosity) and fracture system, the model may incorporate wellsite parameters, such as pore pressures, state of stress, rock mechanical properties, etc. The stresses on the formation may be caused by overburden weight, any superimposed tectonic forces, and by production and injection. The MEM may be built using geomechanical oilfield software, such as PETREL™, or other geomechanical techniques using conventional software as is understood by those of skill in the art.

I. Fracture Parameters

The method 1100 involves 1176 for each wellbore, generating fracture parameters based on wellsite data. The 1176 fracture wellsite parameters may comprise fracture parameters, such as pump rate, volume (e.g., pad fluid and slurry), fracture geometry (e.g., propped fracture length), concentration of the proppant etc., injection fluid parameters (e.g., viscosity, composition, proppant, temperature, density, etc.).

Hydraulic fracture propagation in the reservoir results from the injection of fracturing fluid and proppants into the surface formation as shown, for example, in FIG. 3.1. A fracturing fluid may be mixed in water tanks that can be fed through a gel hydration unit that combines gel and other additives to form the fracturing fluid. The missile manifold carries the fracturing fluid into the high pressure pumps and the field operator uses these high pressure pumps on surface to pump the fracturing fluids to the wellhead through the missile manifold. The pressure generated by the surface pumps is transmitted though the means of the fluid to the rock face in the subsurface as it traverses past the wellhead into the wellbore. Once the rock succumbs to the pressure as it is increased above the in-situ-stress, the fracture initiates and starts to propagate in the reservoir.

The generating 1176 may involve measuring the fracture parameters at the wellsite, for example, by deploying a downhole tool into the wellbore to perform measurements of subsurface formations. For example, as shown in FIG. 3.1, measuring may be performed, for example, using a geophone, logging, and/or other tool to take seismic measurements and/or sense seismic anomalies in the formation. The seismic measurements may be used to generate the microseismic events as shown in FIG. 3.2. These microseismic events may be mapped using conventional techniques as is understood by one of skill in the art.

The generating 1176 may involve modeling fracture parameters by solving governing equations for the wellsite data for the formation to be fractured. Simulation techniques, such as the Unconventional Fracture Model (UFM using UFM™ or other simulator), may be applied to these input parameters from the wellsite to predict the equivalent behavior of rock deformation causing the hydraulic fracture propagation.

Rate of pumping and amount of fluid pumped on the surface is the measure of the extension created in the hydraulic fractures. As the fracturing fluid pumping treatment continues for some duration (e.g. around a couple of hours), the hydraulic fracture extension, the fluid and proppant flow in the fractures is determined from simulation on the collected wellsite information. The sequence of increasing the proppant concentration on the surface is also a parameter that may be recorded while pumping. The proppant concentration increment causes increase in the hydraulic fracture conductivity as proppants fill up the fractured volume.

Surface outcrops, seismic data acquisition and its interpretation, subsurface well logging measurements and their interpretation may be used to develop the map of the pre-existing natural fracture network in the subsurface. With the UFM™ model, the simulator predicts the amount of complexity and variation of the hydraulic fracture footprint as it interacts with the pre-existing natural fractures in the reservoir. See, e.g., Gu, H., Weng, X., Lund, J., Mack, M., Ganguly, U. and Suarez-Rivera R. 2011, Hydraulic Fracture Crossing Natural Fracture at Non-Orthogonal Angles, A Criterion, Its Validation and Applications, SPE 139984 presented at the SPE Hydraulic Fracturing Conference and Exhibition, Woodlands, Tex., Jan. 24-26 (2011). Using one or more of these techniques, the hydraulic fracture geometry and the fracture parameters, such as conductivity, pressure in fractures, temperature, may be modeled from the wellsite data collection.

To simulate the propagation of a complex fracture network, equations governing the underlying physics of the fracturing process may be used. The basic governing equations may include, for example: I) fluid flow in the fracture network, II) fracture deformation, and III) the fracture propagation/interaction criterion. In this example, the fluid flow in the fracture network is determined using equations that assume that fluid flow propagates along a fracture network with the following mass conservation:

$$\frac{\partial q}{\partial s} + \frac{\partial (H_{fl}\bar{w})}{\partial t} + q_L = 0 \qquad (1)$$

where q is the local flow rate inside the hydraulic fracture along the length, $\bar{w}$ is an average width or opening at the cross-section of the fracture at position s=s(x,y), $H_{fl}$ is the height of the fluid in the fracture, and $q_L$ is the leak-off volume rate through the wall of the hydraulic fracture into the matrix per unit height (velocity at which fracturing fluid infiltrates into surrounding permeable medium) which is expressed through Carter's leak-off model. The fracture tips propagate as a sharp front, and the length of the hydraulic fracture at any given time t is defined as l(t).

The properties of driving fluid may be defined by power-law exponent n' (fluid behavior index) and consistency index K'. The fluid flow could be laminar, turbulent or Darcy flow through a proppant pack, and may be described correspondingly by different laws. For the general case of 1D laminar flow of power-law fluid in any given fracture branch, the Poiseuille law (see, e.g., Nolte, 1991) may be used:

$$\frac{\partial p}{\partial s} = -\alpha_0 \frac{1}{\overline{w}^{2n'+1}} \frac{q}{H_{fl}} \left| \frac{q}{H_{fl}} \right|^{n'-1} \quad (2)$$

where $$\alpha_0 = \frac{2K'}{\phi(n')^{n'}} \cdot \left(\frac{4n'+2}{n'}\right)^{n'}; \phi(n') = \frac{1}{H_{fl}} \int_{H_{fl}} \left(\frac{w(z)}{\overline{w}}\right)^{\frac{2n'+1}{n'}} dz \quad (3)$$

Here w(z) represents fracture width as a function of depth at current position s, α is coefficient, n' is power law exponent (fluid consistency index), φ is shape function, and dz is the integration increment along the height of the fracture in the formula.

Fracture width may be related to fluid pressure through the elasticity equation. The elastic properties of the rock (which may be considered as mostly homogeneous, isotropic, linear elastic material) may be defined by Young's modulus E and Poisson's ratio ν. For a vertical fracture in a layered medium with variable minimum horizontal stress $\sigma_h(x, y, z)$ and fluid pressure p, the width profile (w) can be determined from an analytical solution given as:

$$w(x,y,z)=w(p(x,y),H,z) \quad (4)$$

where w is the fracture width at a point with spatial coordinates x, y, z (coordinates of the center of fracture element), and p(x,y) is the fluid pressure, H is the fracture element height, and z is the vertical coordinate along fracture element at point (x,y).

Because the height of the fractures may vary, the set of governing equations may also include the height growth calculation as described, for example, in Kresse, O., Cohen, C., Weng, X, Wu, R., and Gu, H. 2011, *Numerical Modeling of Hydraulic Fracturing in Naturally Fractured Formations.* 45th US Rock Mechanics/Geomechanics Symposium, San Francisco, Calif., June 26-29, the entire contents of which are hereby incorporated herein.

In addition to equations described above, the global volume balance condition may be satisfied:

$$\int_0^t Q(t)dt = \int_0^{L(t)} H(s,t)\overline{w}(s,t)ds + \int_{H_L} \int_0^t \int_0^{L(t)} 2g_L ds dt dh_l \quad (5)$$

where $g_L$ is fluid leakoff velocity, Q(t) is time dependent injection rate, H(s,t) is the height of the fracture at spacial point s(x,y) and at the time t, ds is length increment for integration along fracture length, $d_t$ is time increment, $dh_l$ is increment of leakoff height, $H_L$ is leakoff height, and so is a spurt loss coefficient. Equation (5) provides that the total volume of fluid pumped during time t is equal to the volume of fluid in the fracture network and the volume leaked from the fracture up to time t. Here L(t) represents the total length of the hydraulic fracture network (HFN) at the time t and $S_0$ is the spurt loss coefficient. The boundary conditions may use the flow rate, net pressure and fracture width to be zero at all fracture tips.

The system of Equations 1-5, together with initial and boundary conditions, may be used to represent a set of governing equations. Combining these equations and discretizing the fracture network into small elements may lead to a nonlinear system of equations in terms of fluid pressure p in each element, simplified as f(p)=0, which may be solved by using a damped Newton-Raphson method.

The generating 1176 may involve modeling the smooth fracture behavior to solve the governing equations and determine the smooth fracture parameters. UFMs have been developed to understand subsurface fracture networks. Existing models may be used to simulate the governing equations for cases involving smooth fractures. These models may be used, for example, to simulate complex fracture network propagation in a formation with pre-existing natural fractures. The following patents/applications disclose aspects of this modeling, among other things, and each of the following are incorporated by reference herein in their entireties: U.S. Pat. No. 8,412,500; 2014/0305638, Ser. Nos. 14/350,533; 14/664,362; U.S. Pat. No. 7,784,544; Ser. Nos. 12/462,244; 13/517,007; 14/004,612; 14/126,201; 14/356,369; 13/968,648; 14/423,235; and PCT Application Nos. PCT/US2014/064205; PCT/US2013/076765; and PCT/US2014/045182.

The modeling may be performed using existing modeling software, such as UFM™. Conventional planar fracture models, such as UFM™, may model various aspects of the fracture network, such as application of the governing equations to the smooth fracture. Constrained models may be provided to give a fundamental understanding of involved mechanisms, but may be complex in mathematical description and/or require computer processing resources and time in order to provide accurate simulations of hydraulic fracture propagation. The models may consider various factors and/or data, and may be used for fracturing treatment design during well planning and job execution and in post job evaluation.

Example Fracture Simulation

Figure 12:
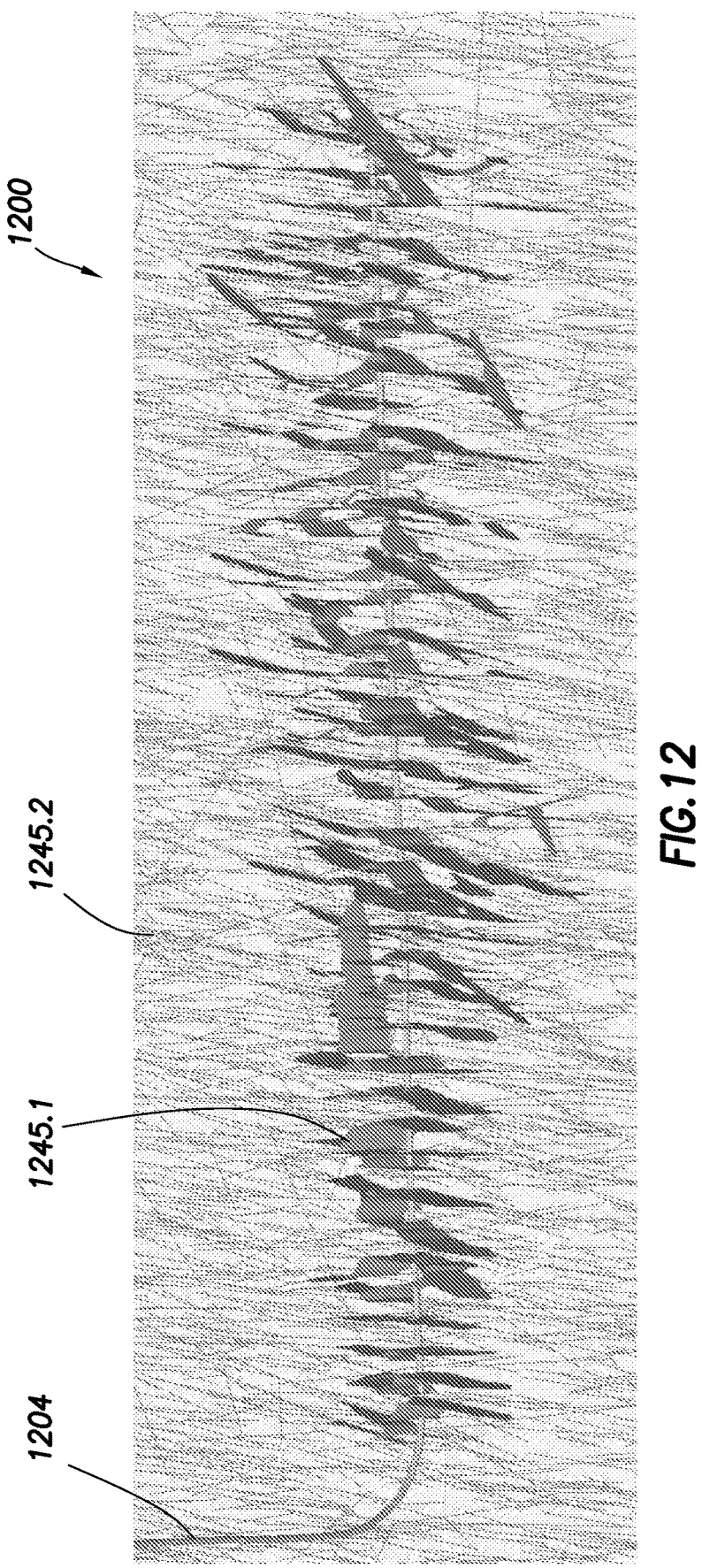
FIG. 12 is a plot depicting a modeled complex fracture network.

FIG. 12 depicts an example fracture a simulation 1200 of a complex model prediction generated using a fracture simulator, such as UFM™. The simulation 1200 shows fractures 1245.1, 1245.2 positioned about a wellbore 1204 and propagating in multiple stages and perforation clusters. The fractures include hydraulic fractures 1245.1 and natural fractures 1245.2 of a discrete fracture network (DFN).

The simulation 1200 is generated by inputting wellsite data into the fracture simulator to generate fracture parameters. The input wellsite data includes a pumping schedule for one stage as input for the simulator as shown in TABLE I below:

TABLE I

| Pump rate (bbl/min)/ (kL/min) | Fluid name | Fluid volume (gal)/(kL) | Proppant | Proppant concentration (PPA) |
|---|---|---|---|---|
| 90/(14.3) | Fracturing fluid | 20000 (75.7) | None | 0 |
| 90/(14.3) | Fracturing fluid | 15000 (56.8) | Proppant type 1 | 0.5 |

TABLE I-continued

| Pump rate (bbl/min)/ (kL/min) | Fluid name | Fluid volume (gal)/(kL) | Proppant | Proppant concentration (PPA) |
|---|---|---|---|---|
| 90/(14.3) | Fracturing fluid | 15000 (56.8) | Proppant type 1 | 1 |
| 90/(14.3) | Fracturing fluid | 15000 (56.8) | Proppant type 2 | 1.5 |
| 90/(14.3) | Fracturing fluid | 15000 (56.8) | Proppant type 3 | 2 |
| 90/(14.3) | Fracturing fluid | 15000 (56.8) | Proppant type 4 | 2.5 |
| 90/(14.3) | Fracturing fluid | 10000 (37.9) | Proppant type 5 | 3 |

TABLE II

| Avg. Young's Modulus | 5.0 Mpsi (34,000 MPa) |
|---|---|
| Avg. Poisson's ratio | 0.25 |
| Avg. In Situ Stress | 5800 Psi (40,000 kPa) |
| Fluid Type | Slickwater |
| Fluid Viscosity | 10 cp |
| Proppant type | 100 mesh and 40/70 mesh sand |

The fracture simulation provided by the fracture simulator, predicts fracture parameters, such as fracture geometry (e.g., extension, height, width, surface area and volume of the fracture) and conductivity of the fracture and fracturing fluid efficiency. Table III below shows parameters generated by the fracture simulator:

TABLE III

| All fracture networks: | | | |
|---|---|---|---|
| EOJ total fracture volume | 14442 ft³ (409 m³) | EOJ leak-off volume | 2799 ft³ (79 m³) |
| Total fracture surface area | 1192081.55 ft² (110748 m²) | Total propped fracture surface area | 654500.67 ft² (6076 m²) |
| Total fracture surface area by pay | 0.00 ft² (0.0 m²) | Total propped fracture surface area by pay | 0.00 ft² (0.0 m²) |
| Maximum surface pressure | 8055 psi (55.5 mPa) | Maximum BH pressure | 6762 psi (46.6 mPa) |
| Estimated closure time | 4916.35 min | Efficiency | 83.77% |
| Current Fracture Network (Index 1): Hydraulic Fracture Geometry: | | | |
| Final extension of HFN in the direction of max | 1038.09 ftUS (316 m) | EOJ fracture width at wellbore | 0.61 in (1.55 cm) |
| Final extension of HFN in the direction of min | 196.51 ftUS (59.9 m) | EOJ average fracture width | 0.16 in (0.41 cm) |
| Max frac height | 281.02 ft (85.7 m) | EOJ total fracture volume | 3992 ft³ (113 m³) |
| Avg. Frac height | 99.28 ft (30.3 m) | EOJ total leak-off volume | 719 ft³ (20.4 m³) |
| Total fracture surface area | 299766.29 ft² (27850 m²) | | |
| Total fracture surface area by pay | 0.00 ft² (0.0 m²) | | |
| Propped Fracture Geometry: | | | |
| Final extension of HFN in the direction of max | 995.78 ftUS (303.5 m) | Avg propped frac height | 99.10 ft (30.2 m) |
| Final extension of HFN in the direction of min | 187.99 ftUS (57.3 m) | Fracture width at wellbore | 0.21 in (0.53 cm) |
| Total propped fracture surface area | 195087.26 ft² (18124 m²) | Average fracture width | 0.03 in (0.08 cm) |
| Total propped fracture surface area by pay | 0.00 ft² (0.0 m²) | | |
| Pressure/Conductivity: | | | |
| EOJ net pressure at wellbore | 490 psi (3378 kPa) | | |
| Average fracture conductivity | 421.45 mD/ft | | |

TABLE I-continued

| Pump rate (bbl/min)/ (kL/min) | Fluid name | Fluid volume (gal)/(kL) | Proppant | Proppant concentration (PPA) |
|---|---|---|---|---|
| 90/(14.3) | Fracturing fluid | 10000 (37.9) | Proppant type 6 | 3.5 |
| 90/(14.3) | Fracturing fluid | 5000 (18.9) | Proppant type 7 | 4 |

The wellsite data also includes the following input parameters as shown in TABLE II below:

II. Reservoir Parameters

The method continues with 1177 generating reservoir parameters. The reservoir parameters (e.g., pressure, flow rate, permeability, viscosity etc.) may be determined based on the wellsite data and the generated fracture parameters 1176. The reservoir parameters 1177 may be generated using reservoir simulation (e.g., ECLIPSE™ OR INTERSECT™). Reservoir simulation may be performed using gridding techniques, such as those described in U.S. Pat. No. 7,716,029, the entire contents of which is hereby incorporated by reference herein.

At the wellsite, measured wellsite data, such as borehole imaging logs, evaluating seismic measurements, ant tracking, sonic measurements, geological measurements, etc., may be used to determine the fracture parameters, such as natural fracture density, spacing and azimuth. Upon running the complex fracture model simulation, the fracture modeling is complete. In order to obtain the dynamic nature of the earth, a reservoir simulation may be performed using numerical analysis. From the reservoir simulation, production parameters (e.g., gas rate, oil rate, water rate, and wellhead pressures) as the well produces post stimulation can be determined.

The reservoir simulator (e.g. ECLIPSE™ or INTERSECT™) uses outputs (e.g., hydraulic fracture properties, hydraulic fracture geometry, etc.) from the fracture simulator and reservoir inputs to generate the reservoir parameters. The reservoir simulator may generate reservoir parameters (e.g., permeability of the reservoir rock, porosity of the reservoir, saturations of fluid present in the reservoir, reservoir compressibility, etc.) from the fracture parameters and the wellsite data (e.g., production that is governed by the choke size at the wellhead).

Example Reservoir Simulation

Production prediction may be performed from the complex hydraulic fracture network as shown in FIG. 12. FIG. 12 represents the extent of the hydraulic fracture and the geometry in from of complex network. The results of the simulation model through the UFM reports the hydraulic fracture conductivity, which are input into the fracture simulator (FIG. 6.2) and the following reservoir properties of Table IV into the reservoir simulator (FIG. 6.1):

TABLE IV

| Porosity | 6.70% |
| --- | --- |
| Permeability | 0.0001 mD |
| Oil Saturation | 80% |
| Gas Saturation | 0% |
| Water Saturation | 20% |
| Reservoir Compressibility | 1.26 × E−5 psi$^{-1}$ (1.84 × E−7 kPa$^{-1}$) |
| Well head pressure | 500 psia (3447 kPa) |

Figure 13:
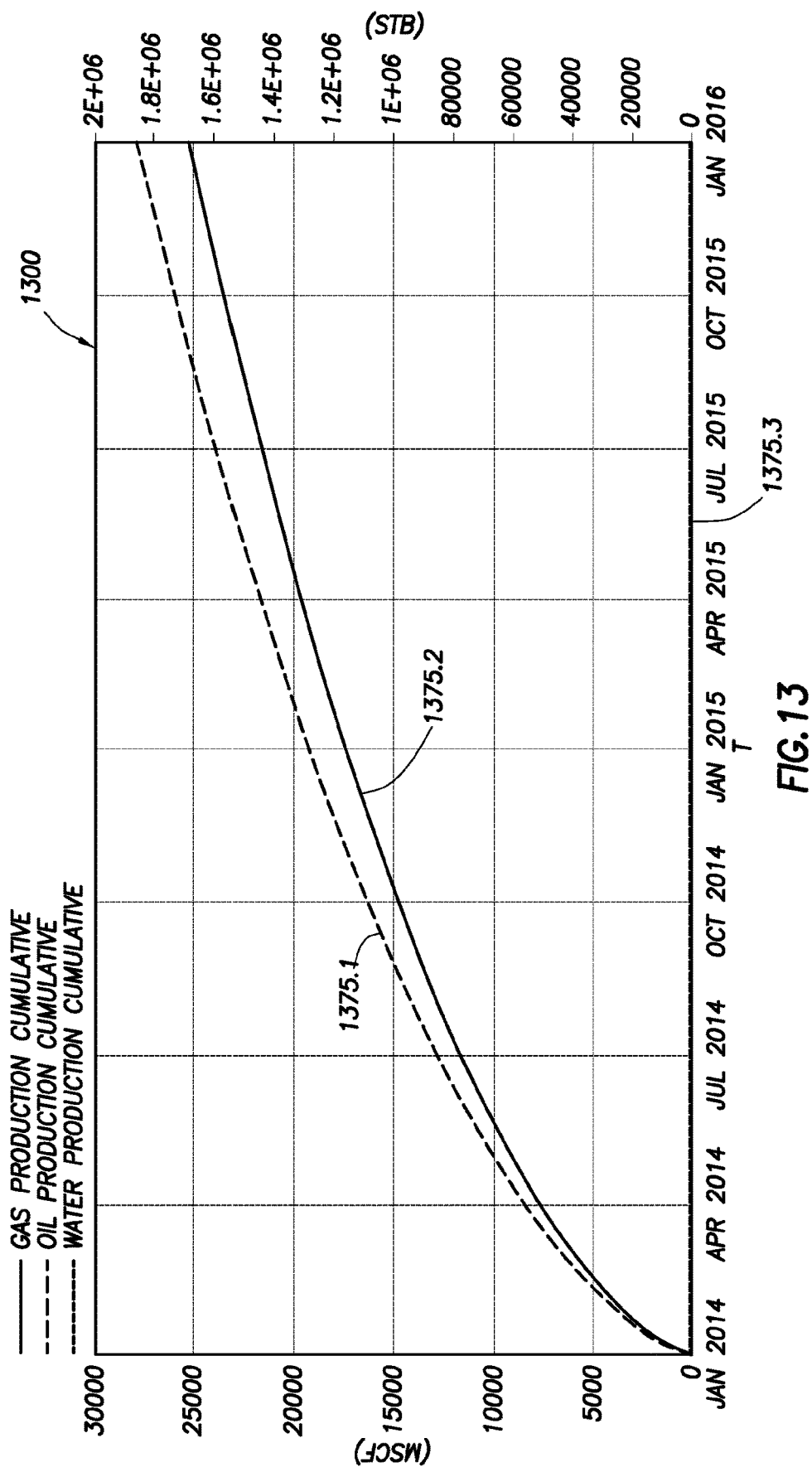
FIG. 13 is a graph of a production prediction for a wellsite.
Figure 14:
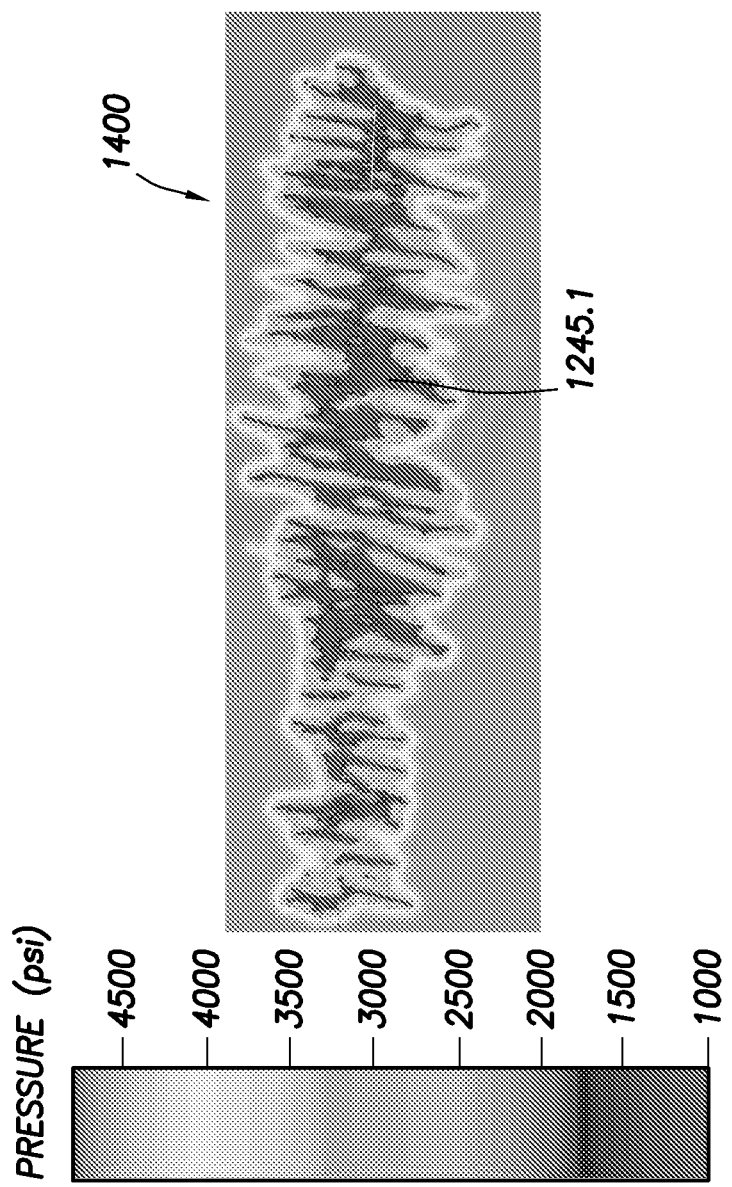
FIG. 14 is a plot depicting a modeled pressure profile for a fracture network.

The reservoir simulator generates outputs as shown in FIGS. 13 and 14. FIGS. 13 and 14 are plots 1300, 1400 depicting the results of the dynamic simulation. The graph 1300 shows gas production simulations [MSCF] (y1-axis) and liquid production volume [STB] versus time T (date) (x-axis). FIG. 13 provides the cumulative gas production 1375.1, oil production 1375.2, and water production 1375.3 based on the reservoir simulation. The production of oil, gas and water is determined for the well after hydraulic fracturing.

The plot 1400 is a pressure depletion profile around the hydraulic fractures 1245.1 as the well produces. The gradations around the hydraulic fractures 1245.1 represent pressure that depicts the extent of depletion around the fractures and the virgin reservoir.

III. Gridding

The method continues with 1178 —integrating the updated mechanical earth model by integrating the fracture parameters for all of the wellbores into the updated earth model of the reservoir simulator. The integrating may involve selecting aspects from the fracture parameters of one or more of the wellbores and gridding such fracture parameters to the reservoir model as shown in FIGS. 6.1-8.2.

FIGS. 15.1, 15.2 and 16 show example gridding that may be used with the method. FIGS. 15.1 and 15.2 show plots 1500.1, 1500.2 of the fracture network 1245.1 applied to a reservoir grid 1554 in a manner similar to those of FIG. 6.3. The plots also show pressure distribution about a fracture network, with decreased pressure shown in the lighter shades near the hydraulic fracture network 1245.1.

FIGS. 15.1, 15.2 shows a simulation with higher unpropped and lower propped fracture conductivity, respectively. FIG. 15.1 also shows the pressure distribution after 30 years or production when the fracture conductivity is increased to 150 md-ft in the propped region and 0.3 md-ft in the unpropped regions of the fracture network. FIG. 15.2 shows the fracture network when propped fracture conductivity is decreased from 15 md-ft to 1.5 md-ft. The graph illustrates the impact of fracture conductivity on gas production, and increasing the un-propped fracture conductivity improves the drainage area of the well.

FIG. 16 schematically shows a grid 1600 usable for performing reservoir simulations, such as those of FIGS. 5-8.2. The grid 1600 defined solution points 1660.2 dispersed about a node 1660.1 and defining lines to bisect the grid and define an area 1662 therein. This grid 1600 shows use of unstructured gridding, such as the portions of the grid adjacent the fracture network that do not conform to the square grid structure of the conventional portion of the grid. FIG. 16 depicts the example where unstructured grids result in hexagonal cells. Combinations of such cells may be used to get an average distribution across the cells so they may be combined.

This unstructured grid may be created to honor hydraulic fracture network geometry. The perpendicular bisector (PEBI) method introduced into reservoir simulation uses a technique also known as a Voronoi grid. Starting from any set of solution points 1660.2, the PEBI cell 1600 volumes 1662 are defined by the perpendicular bisection planes between these points 1660.2. A resulting control volume is defined by the perpendicular planes—it is the set of points closer to the node 1660.1 than any other point.

As shown in FIG. 16, bisectors to the heavy lines join the solution points 1660.2 to enclose the control volume 1662, represented by the shaded area. The grid 1600 is locally orthogonal, and the desirable property of two point flows is obtained. The actual cell volumes may have a variety of shapes, depending on the exact placement of the solution points, and may be hexagonal in two dimensions. Grid refinement occurs naturally in areas where solution points are closely spaced.

This gridding may be used, for example, to average property samples of the grids being combined as shown in FIGS. 6.1-6.3. The 3D grid generation and upscaling may involve averaging the properties over all the samples (which might come from several different fracture patches). For example, the conductivity in the x/y plane may be used to derive the x/y permeability. To compute this, the sample points may be first grouped into columns based on their x/y coordinates. Then, each column may be assigned a conductivity by taking the arithmetic average of the conductivity values of the sample points in the column. Finally, the harmonic average of the column conductivity values are used to obtain the final conductivity average value.

Arithmetic and harmonic averaging may involve: 1) identify all fracture patches in a particular cell, 2) obtaining all the vertices on these patches which fall within the cell, and 3) grouping these vertices according to row/column and do the arithmetic and generate the harmonic averaging. In an example, three fracture patches that are bounded by a rectangular cell (as indicated by the double borders) may be used as a single fracture patch as demonstrated by the data presented in the tables V-VII below. These tables show how the three groups of numbers (grouped as indicated by the double border) are harmonically averaged.

TABLE V

| | | | |
|---|---|---|---|
| 35 | 30 | 2 | 0 |
| 4 | 25 | 5 | 2 |
| 45 | 30 | 10 | 5 |
| 59 | 60 | 50 | 20 |
| 70 | 65 | 60 | 45 |
| 80 | 70 | 65 | 50 |
| 100 | 80 | 70 | 70 |

As an approximation, arithmetically average of each of the columns of each fracture patch, provides the following:

TABLE VI

| | | | |
|---|---|---|---|
| 44.8 | 36.3 | 37.4 | 27.4 |
| 44.8 | 36.3 | 37.4 | 27.4 |
| 44.8 | 36.3 | 374. | 27.4 |
| 44.8 | 36.3 | 37.4 | 27.4 |
| 83.3 | 71.7 | 37.4 | 27.4 |
| 83.3 | 71.7 | 37.4 | 27.4 |
| 83.3 | 71.7 | 37.4 | 27.4 |

By harmonically average the column values for each fracture patch, the following is generated:

TABLE VII

| | | | |
|---|---|---|---|
| 40.1 | 40.1 | 31.7 | 31.7 |
| 40.1 | 40.1 | 31.7 | 31.7 |
| 40.1 | 40.1 | 31.7 | 31.7 |
| 40.1 | 40.1 | 31.7 | 31.7 |
| 77.1 | 77.1 | 31.7 | 31.7 |
| 77.1 | 77.1 | 31.7 | 31.7 |
| 77.1 | 77.1 | 31.7 | 31.7 |

From the Table VII above, a volume average of the values of the fracture patches together may be determined, giving a value of 43.8. This will produce an overall value for the cell—the last thing to account for is pore volume averaging to take account of the matrix property for the cell. In this case, the arithmetic averaged fracture aperture value is used as a fall back on the simple 1-D correction used originally according to the following formula:

$$AVG = (aperture/cell\_width) * frac\_property\_value + (1 - (aperture/cell\_width)) * matrix\_property\_value \quad (6)$$

where "aperture" is the fracture patch width at the cell, "cell width" is the width of the cell, "frac_property_value" is the averaged property value in the fracture patches contained within the cell. "matrix_property_value" is the matrix property at the cell. After averaging the sampled values, the averaged values may be "smeared" over the cell. First, the conductivities by the fracture width may be divided to retrieve the permeability. Then the values are "smeared" over the cell using this procedure to upscale property values to the cell according to the following:

$$Value = (Property\ Value - background\ value) * radiusRatio + background\ value \quad (7)$$

where the "radiusRatio" is the ratio of the fracture width to a nominal fracture cell width, i.e., the width of the structured square fracture cells, "Property Value" is averaged fracture property value. "background value" is the matrix value of the background cell. This completes the making of the actual grid.

Since many fracture cells are not this size, they might be assigned values that may be incorrect. The general unstructured transmissibility calculation is used for 2.5D PEBI grids for faces between layers. The corner point transmissibility calculation is used for faces between columns. Well to cell transmissibility (Twj) depends on the geometry of the connecting grid block, the wellbore radius, and the rock permeability, according to the formula below:

$$Twj = \frac{c\theta Kh}{\ln(ro - rw) + S} \quad (8)$$

where c is a unit conversion factor, $\Theta$ is the angle of the segment connecting with the well, in radians, ro is the pressure equivalent radius of the grid block (which is defined as the distance from the well at which the local pressure is equal to the nodal average pressure of the block), rw is the well bore radius, S is the skin factor, and Kh is the effective permeability times net thickness of the connection.

Conversion factor c is 0.001127 in field units, 0.008527 in metric units, and 3.6 in lab units. In a Cartesian grid its value is 6.2832 (=2π), as the connection is assumed to be in the center of the grid block. For a vertical well the permeability used here is the geometric mean of the i- and j-direction permeabilities, Kh may be defined as:

$$Kh = (Ki * Kj)/2 \quad (9)$$

Example Griding

In an example, the grid of FIGS. 6.1-9.2 may be constructed around a set of solution points from the fracture network. To conform the grids of the fracture simulation to the reservoir simulation, points may be triangulated into a mesh of triangles or tetrahedrons as shown in FIG. 16. A control volume is constructed around the nodes of the resulting mesh to de ne the simulator cell volumes. The grid is locally orthogonal, and the desirable property of two point ows is obtained. The actual cell volumes have a variety of shapes, depending on the exact placement of the solution points, but are typically hexagonal in two dimensions.

Grid re nement occurs naturally in areas where solution points are closely spaced. The variables used in defining the grid are shown in Table IX below to include: a) fracture cell width—The width of the fracture cell along the fracture, b) minimum zone height—The minimum height of a layer in the grid, c) unpropped conductivity—the conductivity at the unpropped regions in the fracture:

TABLE VIII

| | |
|---|---|
| Fracture cell width | 3.28 ft. (1 m) |
| Minimum zone height | 10 ft. (3.05 m) |
| Unpropped conductivity | 1e-3 mD.ft. |
| Bulk cell dimension X | 328 ft. (100 m) |
| Bulk cell dimension Y | 328 ft. (100 m) |
| Angle | 0 deg. |
| Shape | Rectangular |
| Number of cells aggregated along fracture | 1 |

This table also provides the minimum most conductivity in the entire fracture network including: d) bulk cell properties—the shape and size of the background cells in the grid, e) number of cells to aggregate along the fracture—defines the number of cells to be merged together to create a longer cell.

IV. Applications

The method 1100 may also involve additional applications, such as generating integrated wellsite parameters 1180 for the multi-wellbore wellsite, and performing fracture and/or production operations 1182. The integrated dynamic wellsite parameters may then be generated 1180 from the updated MEM and the validated geomechanical parameters. The integrated dynamic wellsite parameters may include, for example, production forecasts of production parameters (e.g., pressure, flow rate, permeability, etc.) using the validated geomechanical parameters as inputs to a reservoir simulator (e.g., INTERSECT™ and/or ECLIPSE™).

The method performing 1182 may involve performing fracture and/or production operations at one or more of the wellbores of the wellsite based on the integrated wellsite parameters. For example, production operations may be performed based on the validated fracture geometry. With the knowledge of the geomechanical parameters, such as microseismic locations, the fractures may be predicted and used to define operational decisions accounting for such locations. The fracturing treatment parameters may be optimized to achieve the desired stimulation objectives to maximize well production.

Part or all of the method may be performed in any order and repeated as desired.

Although the present disclosure has been described with reference to exemplary embodiments and implementations thereof, the present disclosure is not to be limited by or to such exemplary embodiments and/or implementations. Rather, the systems and methods of the present disclosure are susceptible to various modifications, variations and/or enhancements without departing from the spirit or scope of the present disclosure. Accordingly, the present disclosure expressly encompasses all such modifications, variations and enhancements within its scope.

It should be noted that in the development of any such actual embodiment, or numerous implementation, specific decisions must be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure. In addition, the embodiments used/disclosed herein can also include some components other than those cited.

In the description, each numerical value should be read once as modified by the term "about" (unless already expressly so modified), and then read again as not so modified unless otherwise indicated in context. Also, in the description, it should be understood that any range listed or described as being useful, suitable, or the like, is intended that any and every value within the range, including the end points, is to be considered as having been stated. For example, "a range of from 1 to 10" is to be read as indicating each and every possible number along the continuum between about 1 and about 10. Thus, even if specific data points within the range, or even no data points within the range, are explicitly identified or refer to only a few specific ones, it is to be understood that inventors appreciate and understand that any and all data points within the range are to be considered to have been specified, and that inventors possessed knowledge of the entire range and all points within the range.

The statements made herein merely provide information related to the present disclosure and may not constitute prior art, and may describe some embodiments illustrating the invention. All references cited herein are incorporated by reference into the current application in their entirety.

Although only a few example embodiments have been described in detail above, those skilled in the art will readily appreciate that many modifications are possible in the example embodiments without materially departing from the system and method for performing multi-wellbore oilfield (e.g., fracture and production) operations. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method of performing oilfield operations at a wellsite, the wellsite positioned about a subterranean formation having multiple wellbores therethrough and a fracture network therein, the fracture network comprising natural fractures, the method comprising:
generating fracture parameters comprising a hydraulic fracture network of a fracture grid for each of the multiple wellbores based on wellsite data comprising microseismic events and a mechanical earth model;
generating reservoir parameters comprising an updated mechanical earth model of a reservoir grid based on the wellsite data and the fracture parameters;
generating integrated wellsite parameters comprising an integrated earth model by integrating the fracture parameters from the multiple wellbores with the reservoir parameters; and
performing production operations at the multiple wellbores based on the integrated wellsite parameters.

2. The method of claim 1, wherein the generating integrated wellsite parameters comprises:
integrating the fracture and reservoir parameters based on the generated fracture parameters for the multiple wellbores and the updated mechanical earth model; and
generating integrated wellsite parameters based on the updated mechanical earth model for the multiple wellbores.

3. The method of claim 1, further comprising collecting the wellsite data by measuring and mapping microseismic events.

4. The method of claim 1, wherein the integrating comprises selectively combining the fracture grid for a plurality of the multiple wellbores with the reservoir grid.

5. The method of claim 1, further comprising performing fracture operations based on the integrated wellsite parameters.

6. The method of claim 1, wherein the generating the fracture parameters comprises generating the hydraulic fracture network by performing fracture simulations based on the wellsite data.

7. The method of claim 6, wherein the generating the reservoir parameters comprises generating a reservoir grid by performing reservoir simulations based on the wellsite data.

8. The method of claim 1, wherein the integrating comprises conforming a grid of the hydraulic fracture network to the reservoir grid of the reservoir.

9. The method of claim 1, wherein the integrated wellsite parameters comprise estimated microseismic events, formation stresses, and reactive fracture displacement.

10. The method of claim 1, wherein the performing production operations comprises fracturing and producing fluid from the subterranean formation.

11. A method of performing oilfield operations at a wellsite, the wellsite positioned about a subterranean formation having multiple wellbores therethrough and a fracture network therein, the fracture network comprising natural fractures, the method comprising:
   collecting wellsite data comprising microseismic events and a mechanical earth model;
   generating fracture parameters comprising a hydraulic fracture network of a fracture grid for each of the multiple wellbores based on the wellsite data;
   generating reservoir parameters comprising an updated mechanical earth model of a reservoir grid based on the wellsite data and the fracture parameters;
   generating integrated wellsite parameters comprising an integrated earth model by gridding the fracture grid of the multiple wellbores with the reservoir grid; and
   performing production operations at the multiple wellbores based on the integrated wellsite parameters.

12. The method of claim 11, wherein the collecting comprises measuring and mapping the microseismic events.

13. The method of claim 11, wherein the gridding comprises selecting portions of the fracture parameters of a plurality of the multiple wellbores and gridding the selected portions of the fracture parameters to the reservoir grid.

14. A method of performing oilfield operations at a wellsite, the wellsite positioned about a subterranean formation having multiple wellbores therethrough and a fracture network therein, the fracture network comprising natural fractures, the method comprising:
   collecting wellsite data comprising microseismic events and a mechanical earth model;
   generating fracture parameters for each of the multiple wellbores based on the wellsite data;
   generating reservoir parameters comprising an updated mechanical earth model based on the wellsite data and the fracture parameters;
   integrating the updated mechanical earth model by integrating the fracture parameters from the multiple wellbores with the updated mechanical earth model;
   generating integrated wellsite parameters based on the updated mechanical earth model;
   designing fracture operations based on the integrated wellsite parameters; and
   fracturing the wellsite according to the designed fracture operations.

* * * * *